United States Patent
Sugiura et al.

(10) Patent No.: US 12,028,093 B2
(45) Date of Patent: Jul. 2, 2024

(54) ENCODER, DECODER, ENCODING METHOD, DECODING METHOD AND PROGRAM

(71) Applicant: NIPPON TELEGRAPH AND TELEPHONE CORPORATION, Chiyoda-ku (JP)

(72) Inventors: Ryosuke Sugiura, Atsugi (JP); Yutaka Kamamoto, Atsugi (JP); Takehiro Moriya, Atsugi (JP)

(73) Assignee: NIPPON TELEGRAPH AND TELEPHONE CORPORATION, Chiyoda-ku (JP)

( * ) Notice: Subject to any disclaimer, the term of this patent is extended or adjusted under 35 U.S.C. 154(b) by 823 days.

(21) Appl. No.: 16/618,538

(22) PCT Filed: Apr. 18, 2018

(86) PCT No.: PCT/JP2018/016025
§ 371 (c)(1),
(2) Date: Dec. 2, 2019

(87) PCT Pub. No.: WO2018/235418
PCT Pub. Date: Dec. 27, 2018

(65) Prior Publication Data
US 2023/0318622 A1    Oct. 5, 2023

(30) Foreign Application Priority Data

Jun. 22, 2017 (JP) ................................ 2017-121947
Feb. 15, 2018 (JP) ................................ 2018-025040

(51) Int. Cl.
*H03M 7/00* (2006.01)
*H03M 7/30* (2006.01)
(52) U.S. Cl.
CPC ................................ *H03M 7/6011* (2013.01)

(58) Field of Classification Search
CPC ........ H03M 7/40; H03M 7/4075; H03M 7/46; H03M 7/48; H03M 7/30; H03M 7/6005;
(Continued)

(56) References Cited

U.S. PATENT DOCUMENTS 7,362,245 B2 * 4/2008 Kuo ........................ H03M 7/40
341/67
2003/0223646 A1 * 12/2003 O'Neill ................... H03M 7/40
382/246

(Continued)

FOREIGN PATENT DOCUMENTS

| EP | 1 575 032 A2 | 9/2005 |
| WO | WO 2008/059752 A1 | 5/2008 |
| WO | WO 2016/084764 A1 | 6/2016 |

OTHER PUBLICATIONS

International Search Report dated Jun. 26, 2018 in PCT/JP2018/016025 filed on Apr. 18, 2018, 2 pages.
(Continued)

*Primary Examiner* — Linh V Nguyen
(74) *Attorney, Agent, or Firm* — Oblon, McClelland, Maier & Neustadt, L.L.P.

(57) ABSTRACT

A sequence of integer values is encoded and decoded with a number of bits of a decimal value substantially assigned per sample or/and with a smaller memory amount or calculation processing amount than in the prior art. The encoder receives the sequence of integer values as input and outputs an integer code corresponding to the sequence of integer values. An integer transformer (11) obtains one integer value (transformed integer) through algebraically-representable bijective transformation for each of a plurality of sets of integer values included in the inputted sequence of integer values. An integer encoder (12) encodes the transformed integer to thereby obtain an integer code.

28 Claims, 14 Drawing Sheets

(58) Field of Classification Search
CPC ...... H03M 7/42; H03M 7/6011; H03M 13/00; H03M 13/07; H03M 13/1194; H03M 13/03; H03M 7/3062; H03M 13/19; H03M 13/6312; H03M 7/00; H03M 7/24; H03M 7/4006; H03M 7/4093; H03M 7/425

USPC .............................................. 341/59, 67, 85

See application file for complete search history.

(56) References Cited

U.S. PATENT DOCUMENTS

| | | | | |
|---|---|---|---|---|
| 2006/0048038 | A1* | 3/2006 | Yedidia | H03M 13/6312 |
| | | | | 714/793 |
| 2006/0220934 | A1* | 10/2006 | Stromberg | H04N 19/105 |
| | | | | 375/E7.129 |
| 2007/0208792 | A1* | 9/2007 | Berjon | G06T 9/001 |
| | | | | 708/207 |
| 2009/0267812 | A1* | 10/2009 | Chen | H04N 19/13 |
| | | | | 341/67 |
| 2010/0027625 | A1 | 2/2010 | Wik et al. | |
| 2010/0027903 | A1* | 2/2010 | Takamura | H03M 7/40 |
| | | | | 382/248 |
| 2020/0402524 | A1* | 12/2020 | Sugiura | G10L 19/035 |
| 2022/0006469 | A1* | 1/2022 | Sugiura | H03M 7/4075 |

OTHER PUBLICATIONS

Giurcaneanu et al., "Low-Complexity Transform Coding With Integer-To-Integer Transforms", IEEE International Conference on Acoustics, Speech, and Signal Processing, 2001, pp. 2601-2604, [retrieved on Jun. 13, 2018], internet <URL:https://ieeexplore.ieee.org/stamp/stamp.jsp?tp=&arnumber=940534>.

Takamura et al., "Efficient Gaussian Source Coding Based on Distribution Mapping", The Journal of the Institute of Image Information and Television Engineers, 2007, vol. 61, No. 9, pp. 1357-1362 (with English Abstract).

Zelinski et al., "Adaptive Transform Coding of Speech Signals", IEEE Transactions on Acoustics, Speech, and Signal Processing, 1977, vol. ASSP-25, No. 4, pp. 299-309.

Malvar, H.S., "Adaptive Run-Length/ Golomb-Rice Encoding of Quantized Generalized Gaussian Sources with Unknown Statistics", Microsoft Research, Proceedings of the Data Compression Conference (DCC'06), XP-002718963, 2006, 10 pages.

* cited by examiner

ENCODER, DECODER, ENCODING METHOD, DECODING METHOD AND PROGRAM

TECHNICAL FIELD

The present invention relates to a technique for encoding or decoding a sample sequence composed of integer values such as a sample sequence of voice or acoustic time-series digital signals.

BACKGROUND ART

As a technique for encoding a sample sequence for the purpose of compression, there is a technique that reduces a bit length used for description of a sample sequence by reversibly encoding finite precision values (hereinafter referred to as "integer values") obtained by quantizing sample values. In this technique, the code of which length is assigned to which integer value is directly connected to the performance of compression. This fact is no exception to engineering application of encoding/decoding of a sample sequence such as image encoding for encoding/decoding a sample sequence of an image signal, acoustic encoding for encoding/decoding a sample sequence of an acoustic signal.

Generally, in reversible encoding of variable length, there are constraints of the configuration of a code assigned to an integer value due to constraints of decoding possibility. More specifically, when a short code is assigned to a certain integer value, there is a constraint that a long code has to be assigned to another integer value to make the code decodable. Therefore, to improve the compression performance, a code configuration (assignment of code to each integer value) needs to be suitable for a distribution of values in a sequence of integer values. More specifically, it is possible to reduce an expected value of a compressed bit length of a sequence of integer values by assigning a short code to an integer value having a high appearance probability and assigning a long code to an integer value having a low appearance probability.

In the above-described reversible encoding, it is a Golomb-Rice code that has been used as one of simplest variable length codes. When a sequence of integer values belongs to a Laplacian distribution, that is, when an appearance probability of integer values is exponentially lowered with respect to the magnitude of the values, the Golomb-Rice code is known to achieve a minimum expected bit length (minimum bit length). Since this Golomb-Rice code has an extremely simple configuration, it is widely used.

However, a sequence of integer values to be compressed does not always follow the Laplacian distribution. For example, the sequence of integer values to be compressed can have a distribution, such as a Gaussian distribution, with a smaller variation of values than the Laplacian distribution or the sequence of integer values to be compressed can have a distribution with a greater variation of values than the Laplacian distribution. When such a sequence of integer values is encoded with the Golomb-Rice code, the compression performance deteriorates because the distribution of the sequence of integer values is deviated from the Laplacian distribution.

Therefore, when a sequence of integer values following distributions other than the Laplacian distribution is compressed, a Huffman code or an arithmetic code can be used whereby an optimum code for an arbitrary distribution can be configured. However, the Huffman code or the arithmetic code requires a meticulous design that a dictionary of codes needs to be created in advance or an upper limit has to be actually set to inputted integer values unlike the Golomb-Rice code.

A technique described in non-patent literature 1 is also available as a technique for encoding a sequence of integer values with a denser distribution than the Laplacian distribution, that is, a sequence of integer values with a smaller variation than the Laplacian distribution. According to the technique described in non-patent literature 1, one integer value is acquired for each set of two integer values in the inputted sequence of integer values and the acquired integer values are subjected to Golomb-Rice encoding. According to the technique described in non-patent literature 1, one integer value is assigned to a set of two integer values according to a predetermined rule as shown in a mapping example in FIG. 1, that is, according to a rule that the smaller the sum of squares of two integer values forming the set, the smaller integer value is assigned.

As the technique for encoding a sample sequence, there is also a technique described in non-patent literature 2. The technique described in non-patent literature 2 is a technique that obtains a sequence with a number of bits assigned to each sample included in a sample sequence, which is a frequency spectral sequence of a voice acoustic signal and encodes each sample of the sample sequence so as to obtain a code with each number of bits included in the sequence with the number of bits. The technique described in non-patent literature 2 does not perform encoding by assuming a statistical distribution of a sample sequence but obtains a sequence with a number of bits with reference to an envelope of a frequency spectral sequence of a voice acoustic signal or the like.

PRIOR ART LITERATURE

Non-Patent Literature

Non-patent literature 1: Masayuki Takamura, Yoshiyuki Yajima, "Efficient Gaussian Source Coding Based on Distribution Mapping," the journal of the Institute of Image Information and Television Engineers, Vol. 61, No. 9, pp. 1357-1362, 2007

Non-patent literature 2: R. Zelinski and P. Noll, "Adaptive transform encoding of voice signals," in IEEE Transactions on Acoustics, Speech, and Signal Processing, vol. 25, no. 4, pp. 299-309, August 1977.

SUMMARY OF THE INVENTION

Problems to be Solved by the Invention

The technique described in non-patent literature 1 can compress a sequence of integer values following a denser distribution than a Laplacian distribution into a code length smaller than a Golomb-Rice code, but since it assigns one integer value to a set of two integer values according to a predetermined rule, an encoder and a decoder are normally configured to store a mapping table to implement mapping as shown in FIG. 1 in a storage in advance and search the mapping table when a set of two integer values is inputted. When such a configuration is adopted, the mapping table becomes larger in proportion to the square of the domain of integer values in the inputted sequence of integer values, and so when the domain of integer values is large, there is a problem that the memory size of the storage for storing the mapping table is large or a problem that a large amount of calculation processing is required to search for one integer value corresponding to a set of two integer values from the mapping table.

A configuration in which not a mapping table but a predetermined rule as shown in FIG. 1 is stored in the encoder and the decoder may be possible, but the rule shown in FIG. 1 needs to be searched for sequentially from the center every time a set of two integer values is inputted and there is a problem that when the domain of integer values is large, a large amount of calculation processing is required.

According to the technique described in non-patent literature 2, compression is possible with distortion suppressed to a low level under a condition with high bit rate, whereas only a number of bits of integer values can be assigned for each sample of frequency spectrum, and so there is a problem that the compression efficiency deteriorates under a condition with low bit rate and distortion of a decoding sample sequence corresponding to an average number of bits assigned to the sample sequence increases.

It is an object of the present invention to implement encoding and decoding more suitable for a sequence of integer values. More specifically, it is an object of the present invention to implement encoding and decoding that substantially assign a number of bits of decimal value per sample and implement encoding and decoding for a sequence of integer values following a distribution whose variation is different from that of a Laplacian distribution in particular through simple association with all integer values similar to a Golomb-Rice code with smaller amounts of memory and calculation processing than in the prior art.

Means to Solve the Problem

In order to solve the above-described problems, an encoder according to a first aspect of the invention comprises an integer transformer that obtains one integer value (hereinafter referred to as a "transformed integer") through algebraically-representable bijective transformation for each of a plurality of sets of integer values included in an inputted sequence of integer values and an integer encoder that obtains a code by encoding the respective transformed integers. The integer encoder preferably obtains the code by Golomb-Rice encoding the respective transformed integers.

In order to solve the above-described problems, an encoder according to a second aspect of the invention comprises an integer transformer that obtains a plurality of integer values (hereinafter referred to as "transformed integers") through bijective transformation for each integer value included in an inputted sequence of integer values and an integer encoder that obtains a code by Golomb-Rice encoding the transformed integers.

In order to solve the above-described problems, an encoder according to a third aspect of the invention comprises a parameter determiner that obtains an index value corresponding to a property of distribution of integer values in an integer sequence for each of a partial sequence of a predetermined number of integer values (hereinafter referred to as an "integer sequence") of an inputted sequence of integer values, an integer transformer that selects a transformation process based on the index value from among a plurality of alternatives including at least any one of a transformation process (hereinafter referred to as a "transformation process A") that obtains one integer value as a transformed integer through bijective transformation for each set of a plurality of integer values (MA integer values; MA is an integer equal to or greater than 2) included in the integer sequence; and a transformation process (hereinafter referred to as a "transformation process B") that obtains a plurality of integer values (MB integer values; MB is an integer equal to or greater than 2) as transformed integers through bijective transformation for each set of integer values included in the integer sequence, and obtains a sequence of transformed integers by performing the selected transformation process on the integer sequence and an integer encoder that obtains a code by Golomb-Rice encoding each integer value included in the sequence of transformed integers.

In order to solve the above-described problems, a decoder according to a fourth aspect of the invention comprises an integer decoder that obtains one integer value (hereinafter referred to as a "transformed integer") by decoding an inputted code and an integer inverse transformer that obtains a plurality of integer values from the transformed integer through algebraically-representable bijective transformation. The integer decoder preferably obtains the transformed integer by Golomb-Rice decoding the code.

In order to solve the above-described problems, a decoder according to a fifth aspect of the invention comprises an integer decoder that obtains a plurality of integer values (hereinafter referred to as "transformed integers") by Golomb-Rice decoding an inputted code and an integer inverse transformer that obtains one integer value from the transformed integers through bijective transformation.

In order to solve the above-described problems, a decoder according to a sixth aspect of the present invention is a decoder that obtains a decoded integer sequence by decoding an inputted parameter code and an integer code for each predetermined section, the decoder comprising a parameter decoder that obtains an index value by decoding the inputted parameter code for each predetermined section, an integer decoder that obtains a sequence of integer values (hereinafter referred to as a "transformed integer sequence") by Golomb-Rice decoding the inputted integer code for each predetermined section, and an integer inverse transformer that selects a transformation process for each predetermined section based on the index value for each predetermined section from among a plurality of alternatives including at least any one of a transformation process (hereinafter referred to as an "inverse transformation process A") that obtains a plurality of integer values (MA integer values; MA is an integer equal to or greater than 2) through bijective transformation for each transformed integer which is one integer value included in the transformed integer sequence and a transformation process (hereinafter referred to as an "inverse transformation process B") that obtains one integer value through bijective transformation for each of the transformed integers which are a plurality of integer values (MB integer values; MB is an integer equal to or greater than 2) included in the transformed integer sequence, and obtains a sequence of integer values as the decoded integer sequence by performing the selected transformation process on the transformed integer sequence for each predetermined section.

Effects of the Invention

According to the present invention, it is possible to implement encoding and decoding more suitable for a sequence of integer values. More specifically, it is possible to implement encoding and decoding that substantially assign a number of bits of decimal value per sample and implement encoding and decoding for a sequence of integer values following a distribution whose variation is different from that of a Laplacian distribution in particular through simple association with all integer values similar to a Golomb-Rice code with smaller amounts of memory and calculation processing than in the prior art.

DETAILED DESCRIPTION OF THE EMBODIMENTS

Figure 1:
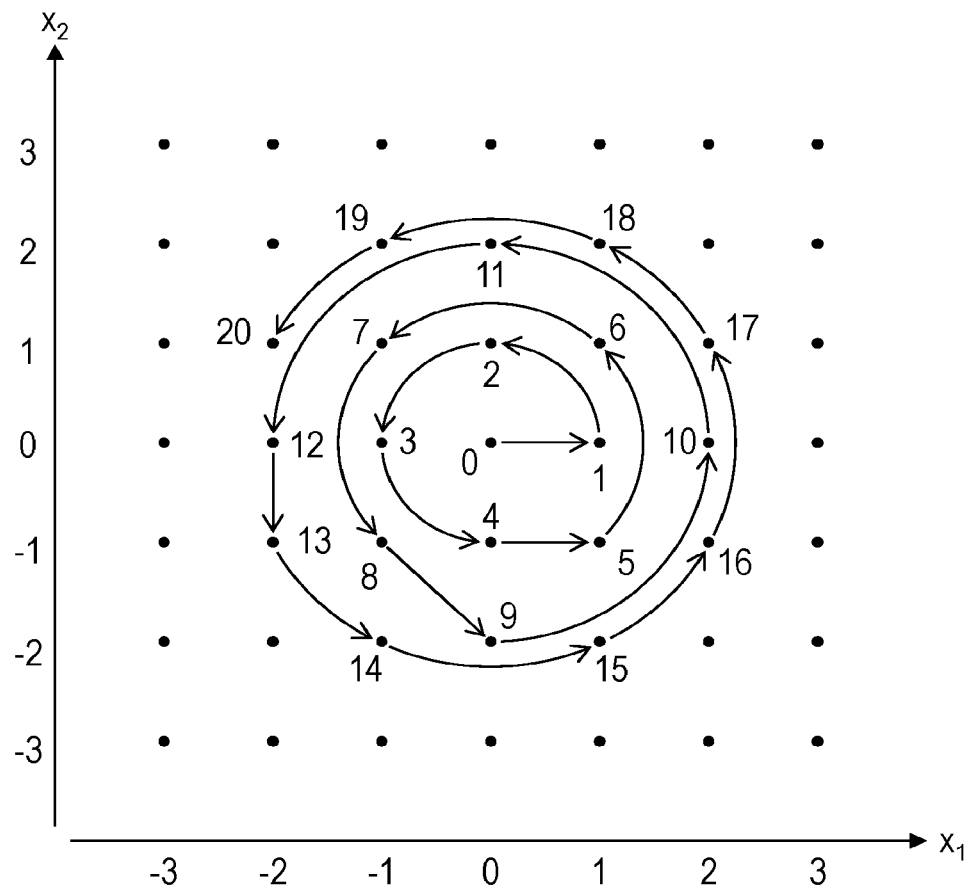
FIG. 1 is a diagram illustrating an example of mapping that defines assignment of one integer value to a set of two integer values.

Hereinafter, embodiments of the present invention will be described in detail. Note that components having the same function in the drawings are assigned the same reference numerals and duplicate description thereof will be omitted.

Symbol "~" used in the text should originally be written directly above an immediately following character, but due to restrictions on the text writing method, it is written immediately before the character. In equations, this symbol is written at its original position, that is, directly above the character.

First Embodiment

<<Encoder>>

Figure 2:
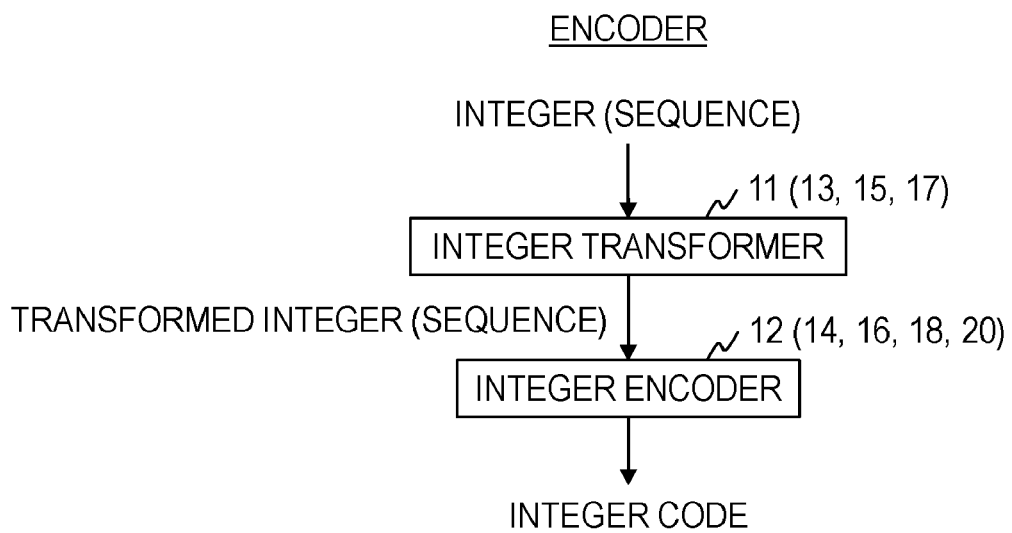
FIG. 2 is a diagram illustrating a functional configuration of an encoder of a first embodiment.
Figure 3:
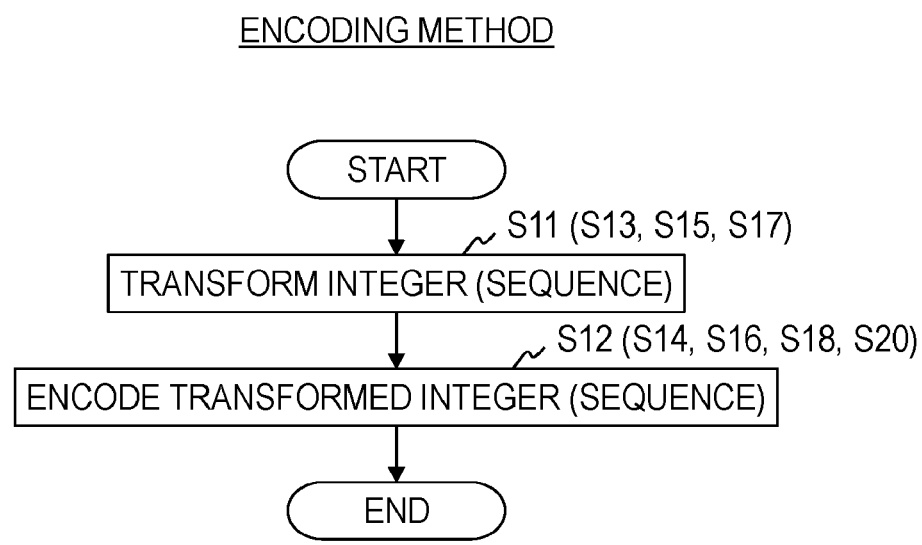
FIG. 3 is a diagram illustrating a processing procedure for an encoding method of the first embodiment.

A processing procedure for an encoding method executed by an encoder of a first embodiment will be described with reference to FIG. 2 and FIG. 3. The encoder of the first embodiment is provided with, for example, an integer transformer 11 and an integer encoder 12 as shown in FIG. 2. The encoding method of the first embodiment is implemented by the encoder executing a process in each step shown in FIG. 3.

A sequence of integer values is inputted to the encoder of the first embodiment. As the sequence of integer values, some or all of signals, for example, obtained by transforming voice or music or the like collected using a microphone into a digital signal in a time domain or frequency domain or by transforming images or video captured by a camera into a digital signal in a time domain or frequency domain may be quantized into finite precision values and inputted using an existing technique. More specifically, examples of such a sequence of integer values include a sequence of integer values obtained by transforming a time-domain sound signal into 2N-point MDCT coefficient sequence in the frequency domain in frame units of a predetermined time length and making each coefficient of the MDCT coefficient sequence a non-negative integer value or a sequence of integer values obtained by making each sample value of a time-domain sound signal a non-negative integer value in frame units of a predetermined time length.

The encoder of the first embodiment obtains one integer value through algebraically-representable bijective transformation on each of a set of two integer values (hereinafter also referred to as an "integer set") in the inputted sequence of integer values, applies variable length encoding to the obtained sequence of integer values and thereby implements an encoding process having a shorter bit length than Golomb-Rice encoding on the sequence of integer values having a denser distribution than the Laplacian distribution.

[Integer Transformer 11]

Of sequences of integer values inputted to the encoder, a sequence of integer values corresponding to 2N samples (N is a natural number) is inputted to the integer transformer 11 at a time. The inputted sequence of integer values is assumed to be an integer sequence $x\_1, x\_2, \ldots, x\_2N$. The integer transformer 11 obtains N sets of two integer values from the inputted integer sequence $x\_1, x\_2, \ldots, x\_2N$ according to a predetermined rule, obtains one integer value through algebraically-representable bijective transformation for the respective integer sets, and outputs the obtained sequence of N integer values $y\_1, y\_2, \ldots, y\_N$ to the integer encoder 12 (step S11). As the method for obtaining one integer value through algebraically-representable bijective transformation on the respective integer sets, for example, a method for obtaining one integer value y according to formula (1) where the two integer values forming the integer set are assumed to be $x_1$ and $x_2$ is used. Hereinafter, the sequence $y\_1, y\_2, \ldots, y\_N$ is referred to as a "transformed integer sequence."

$$y = \max(x_1, x_2)^2 + 2\min(x_1, x_2) + a \quad \begin{cases} \text{if } x_1 < x_2 \quad a = 1 \\ \text{otherwise} \quad a = 0 \end{cases} \quad (1)$$

Here, the predetermined rule for obtaining N integer sets may be any rule that can be stored in the encoder and the decoder in advance such as a rule that two adjacent integer values in the inputted integer sequence $x\_1, x\_2, \ldots, x\_2N$ are assumed to be an integer set, that is, a rule that $x\_1$ and $x\_2$, $x\_3$ and $x\_4$, ..., $x\_2N-1$ and $x\_2N$ are assumed to be integer sets respectively.

In the case of the rule that two adjacent integer values are assumed to be an integer set, the integer transformer 11 obtains a transformed integer $y\_1$ from an integer set of $x\_1$ and $x\_2$ of the inputted integer sequence $x\_1, x\_2, \ldots, x\_2N$, obtains a transformed integer $y\_2$ from an integer set of x_3 and x_4, . . . , obtains a transformed integer y_N from an integer set of x_2N−1 and x_2N and outputs a transformed integer sequence y_1, y_2, . . . , y_N which is an obtained sequence of transformed integers.

Note that in the case of N=1, the integer transformer 11 obtains one integer value through algebraically-representable bijective transformation on the inputted set of two integer values and outputs the obtained one integer value as a transformed integer.

[Integer Encoder 12]

The transformed integer sequence y_1, y_2, . . . , y_N outputted by the integer transformer 11 is inputted to the integer encoder 12. The integer encoder 12 Golomb-Rice encodes each integer value included in the transformed integer sequence y_1, y_2, . . . , y_N, that is, obtains Golomb-Rice codes C_1, C_2, . . . , C_N respectively for respective integer values with a predetermined Rice parameter r and outputs a code group of the obtained codes as an integer code (step S12).

Note that the predetermined Rice parameter r may be predetermined and stored in the encoder and the decoder in advance or, for example, the integer encoder 12 may perform Golomb-Rice encoding using the same Rice parameter r for each of the transformed integer sequence y_1, y_2, . . . , y_N, and a code corresponding to the Rice parameter r used for Golomb-Rice encoding added to the Golomb-Rice codes C_1, C_2, . . . , C_N may be outputted as an integer code.

<<Decoder>>

Figure 4:
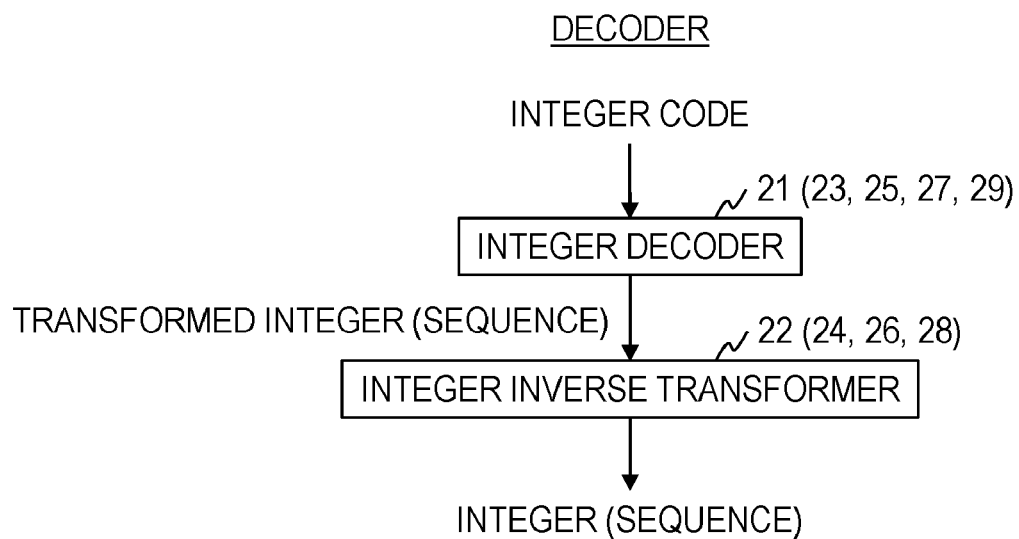
FIG. 4 is a diagram illustrating a functional configuration of a decoder of the first embodiment.
Figure 5:
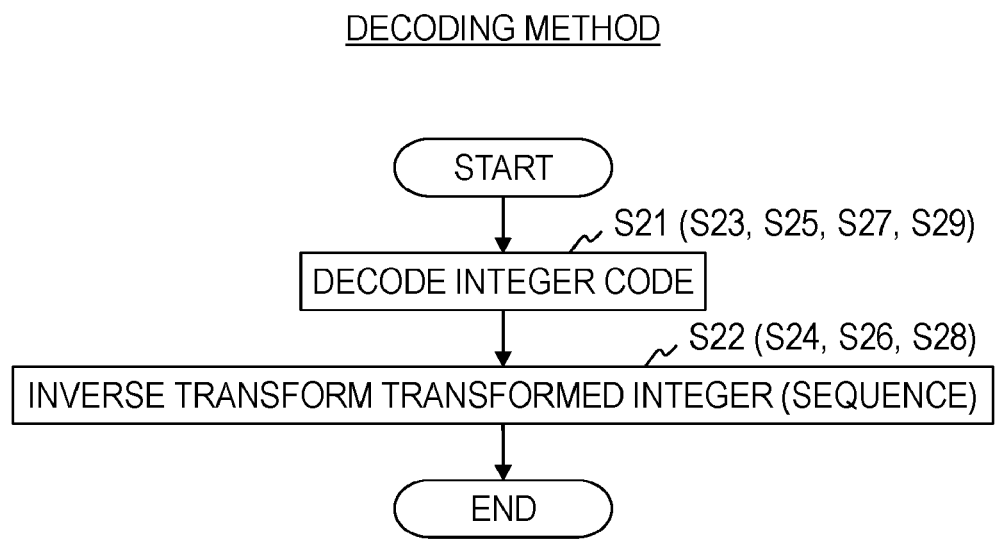
FIG. 5 is a diagram illustrating a processing procedure for a decoding method of the first embodiment.

A processing procedure for a decoding method executed by a decoder of the first embodiment will be described with reference to FIG. 4 and FIG. 5. As shown in FIG. 4, the decoder of the first embodiment is provided with, for example, an integer decoder 21 and an integer inverse transformer 22. The decoding method of the first embodiment is implemented by the decoder executing a process in each step shown in FIG. 5.

An integer code outputted by the encoder of the first embodiment is inputted to the decoder of the first embodiment. The decoder of the first embodiment decodes the inputted integer code through a decoding process corresponding to the encoder of the first embodiment, obtains a sequence of integer values, obtains two integer values through transformation inverse to that of the encoder of the first embodiment for the respective integer values in the obtained sequence of integer values to thereby reconstruct the sequence of integer values itself inputted to the encoder of the first embodiment.

[Integer Decoder 21]

N (N is a natural number) integer codes inputted to the decoder are inputted at a time to the integer decoder 21. The integer codes inputted here are assumed to be C_1, C_2, . . . , C_N. The integer decoder 21 Golomb-Rice decodes each of the inputted integer codes C_1, C_2, . . . , C_N, that is, obtains integer values y_1, y_2, . . . , y_N from the respective integer codes C_1, C_2, . . . , C_N which are Golomb-Rice codes with a predetermined Rice parameter r and outputs the obtained sequence of integer values to the integer inverse transformer 22 as a transformed integer sequence y_1, y_2, . . . , y_N (step S21). As the predetermined Rice parameter r, one similar to that of the corresponding encoder is used. That is, a Rice parameter r which is predetermined and stored in the decoder in advance may be used or a Rice parameter r obtained by decoding a code corresponding to the Rice parameter r included in the integer codes may be used.

[integer Inverse Transformer 22]

The transformed integer sequence y_1, y_2, . . . , y_N outputted by the integer decoder 21 is inputted to the integer inverse transformer 22. The integer inverse transformer 22 performs transformation inverse to that performed by the integer transformer 11 of the encoder of the first embodiment on the respective integer values included in the inputted transformed integer sequence y_1, y_2, . . . , y_N to obtain N sets of two integer values, obtains and outputs an integer sequence x_1, x_2, . . . , x_2N according to a rule corresponding to the rule carried out by the integer transformer 11 of the encoder of the first embodiment from the obtained N integer sets (step S22).

When the integer transformer 11 of the encoder of the first embodiment performs transformation according to formula (1), the integer inverse transformer 22 obtains two integer values $x_1$ and $x_2$ from one integer value y according to formula (2) as transformation inverse to that in formula (1).

$$\text{if } y - \lfloor \sqrt{y} \rfloor^2 \text{ is even} \tag{2}$$
$$x_1 = \lfloor \sqrt{y} \rfloor$$
$$x_2 = \frac{(y - \lfloor \sqrt{y} \rfloor^2)}{2}$$
otherwise
$$x_1 = \frac{(y - \lfloor \sqrt{y} \rfloor^2 - 1)}{2}$$
$$x_2 = \lfloor \sqrt{y} \rfloor$$

Here, in formula (2), $$\lfloor \sqrt{y} \rfloor$$

is a flooring function of the square root of y, that is, a largest integer not exceeding the square root of y.

The integer inverse transformer 22 may execute, for example, procedures in Steps A-1 to A-3-1 or Steps A-1, A-2 and A-3-2 shown below instead of the calculation according to formula (2).

Step A-1: Obtain largest integer b not exceeding square root of y

Step A-2: Obtain square ($b^2$) of b

Step A-3-1: When a difference between squares of y and b is an even number, that is, when $y-b^2$ is an even number, assume b as an integer value $x_1$, subtract square of b from y, divide resulting value by 2 and obtain resulting value $(y-b^2)/2$ as an integer value $x_2$ Step A-3-2: When a difference between squares of y and b is an odd number, that is, when $y-b^2$ is an odd number, assume b as an integer value $x_2$, subtract square of b plus 1 from y, divide this by 2 and obtain resulting value $(y-b^2-1)/2$ as an integer value $x_1$.

When the rule carried out by the integer transformer 11 of the encoder of the first embodiment is a rule that two adjacent integer values are assumed to be an integer set, the integer inverse transformer 22 obtains an integer set of integer value x_1 and integer value x_2 from the transformed integer y_1 of the inputted transformed integer sequence y_1, y_2, . . . , y_N, obtains an integer set of integer value x_3 and integer value x_4 from the transformed integer y_2, . . . , obtains an integer set of integer value x_2N−1 and integer value x_2N from the transformed integer y_N, and outputs an integer sequence x_1, x_2, . . . , x_2N which is a sequence of obtained integer sets.

<Description of Principle of Invention>

Principles of the present invention will be described here.

The Golomb-Rice code is intended to associate all non-negative integer values x with a code by specifying a Rice parameter r as shown in Table 1.

TABLE 1

| Integer value x | Binary notation | Code (r = 0) | Code (r = 1) | Code (r = 2) |
|---|---|---|---|---|
| 0 | 0000 | 1 | 1 0 | 1 00 |
| 1 | 0001 | 01 | 1 1 | 1 01 |
| 2 | 0010 | 001 | 01 0 | 1 10 |
| 3 | 0011 | 0001 | 01 1 | 1 11 |
| 4 | 0100 | 00001 | 001 0 | 01 00 |
| 5 | 0101 | 000001 | 001 1 | 01 01 |
| 6 | 0110 | 0000001 | 0001 0 | 01 10 |
| 7 | 0111 | 00000001 | 0001 1 | 01 11 |
| 8 | 1000 | 000000001 | 00001 0 | 001 00 |
| 9 | 1001 | 0000000001 | 00001 1 | 001 01 |
| ... | ... | ... | ... | ... |

For simplicity, a case with r=0 will be described. A bit length B(x) of a Golomb-Rice code corresponding to an integer value x is as shown in formula (3), which has a linear relationship with respect to the magnitude of the integer value x.

$$B(x) = x + 1 \quad (3)$$

Since assignment of an optimum bit length of code with respect to a distribution p(x) of an integer value x in the inputted integer sequence is given by a logarithmic value of the distribution, it is understandable that the Golomb-Rice code is optimum to the distribution in formula (4), that is, a Laplacian distribution of a discrete system.

$$p_1(x) = \frac{1}{2} \cdot \frac{1}{2^x} \quad (4)$$

When the possible range of the inputted integer value x is all positive/negative integer values, it is known that a Golomb-Rice code may be assigned according to formula (6), which is the integer value x in formula (3) substituted by x' obtained according to formula (5):

$$\text{if } (x > 0) \; x' = 2|x| - 1 \quad (5)$$

$$\text{otherwise } x' = 2|x|$$

$$B(x) = x' + 1 \quad (6)$$

The following description is limited to a case where integer values are non-negative values, and based on the above fact, the possible range of integer values is also adaptable to all integer values. It goes without saying that codes 0 and 1 are the same even when they are inverted.

In the present invention, to configure codes suitable for integer sequences following denser or sparser distributions than a Laplacian distribution, transformation is performed from a set of a plurality of integer values into one integer value or from one integer value into a set of a plurality of integer values and Golomb-Rice codes are applied to transformed integer values.

First, a configuration of codes suitable for integer sequences following denser distributions than the Laplacian distribution will be described. Denser distributions here refer to distributions having a high appearance probability of small integer values and having a low appearance probability of large integer values. It is not possible to implement configurations with codes optimum to such distributions unless the presence of codes having one bit or less per sample of integer values is allowed. Thus, the present invention assigns one code to a set of integer values of two samples and thereby implements a configuration that allows the presence of codes having an average number of bits of 1 or less per sample.

To assign one code to a set of integer values with a smaller amount of memory and a smaller amount of calculation processing than in the prior art, the present invention first transforms a set of integer values $(x_1, x_2)$ into one integer value y as shown in formula (1) described above. Formula (1) described above is such a transformation that the square of the maximum value in a set of integer values is added to the double of the minimum value and 0 or 1 is added thereto according to a magnitude relationship between the integer values. In formula (1) described above, $x_1$ and $x_2$ may be reversed. This transformation is bijective mapping from two integer values into one integer value, one integer value y is uniquely determined from a set of integer values $(x_1, x_2)$, and the opposite of this, that is, transformation from one integer value y to a set of integer values $(x_1, x_2)$ is also uniquely determined, and so inverse transformation on the decoding side is possible. By assigning a Golomb-Rice code to this transformed integer value y, codes suitable for integer values belonging to a dense distribution are assigned.

Table 2 shows examples of codes according to the present invention with respect to a set of integer values $(x_1, x_2)$ when Rice parameter r=0.

TABLE 2

| | $x_1$ | | |
|---|---|---|---|
| $x_2$ | 0 | 1 | 2 |
| 0 | 1 (y = 0) | 01 (y = 1) | 00001 (y = 1) |
| 1 | 001 (y = 2) | 0001 (y = 3) | 0000001 (y = 6) |
| 2 | 000001 (y = 5) | 00000001 (y = 7) | 000000001 (y = 8) |

Table 3 shows examples of Golomb-Rice codes with respect to a set of integer values $(x_1, x_2)$ when Rice parameter r=0.

TABLE 3

| | $x_1$ | | |
|---|---|---|---|
| $x_2$ | 0 | 1 | 2 |
| 0 | 11 | 011 | 0011 |
| 1 | 101 | 0101 | 00101 |
| 2 | 1001 | 01001 | 001001 |

As is seen from Table 2 and Table 3, according to the present invention, codes shorter than a Golomb-Rice code can be assigned to sets of small values.

Figure 6A:
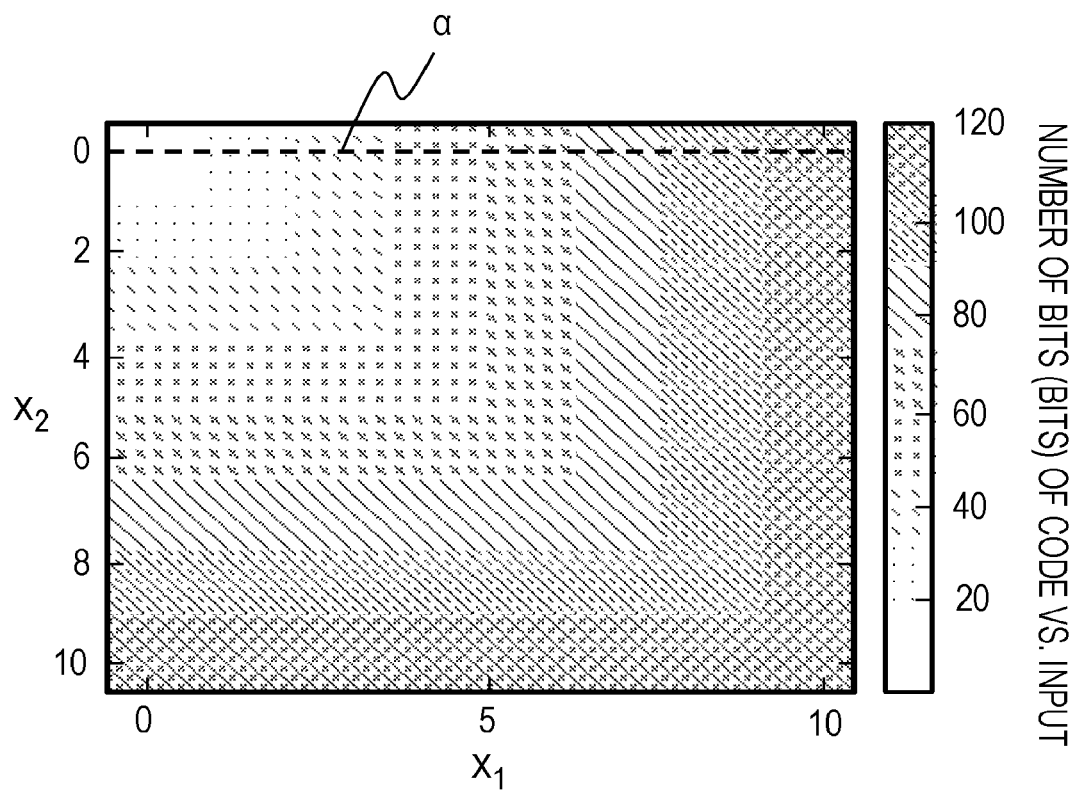
FIG. 6 is a diagram illustrating a bit length of a code corresponding to a set of two integer values.
Figure 6B:
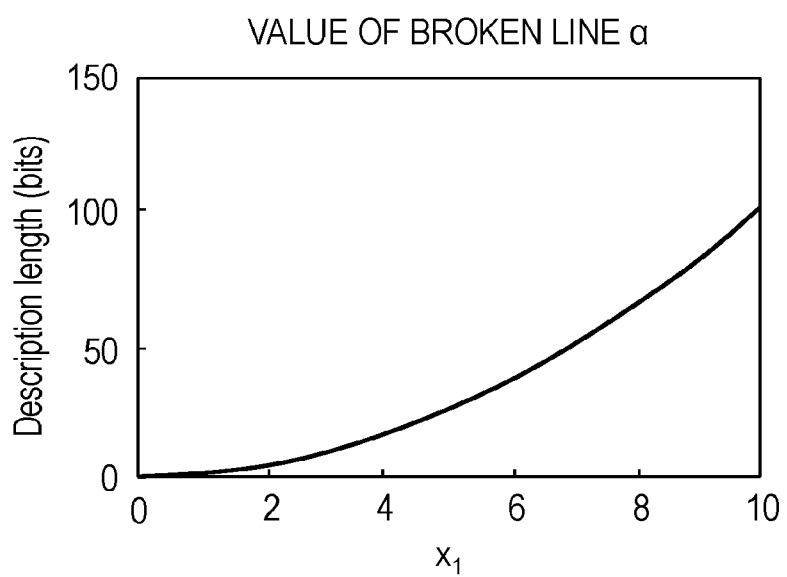

FIG. 6A illustrates the number of bits of a code assigned to a set of integer values $(x_1, x_2)$ in the present invention. In a graph on the left side, the horizontal axis represents a value of $x_1$ and the vertical axis represents a value of $x_2$, and the type of hatching represents the number of bits of a code. A relationship between the type of hatching and the number of bits is as shown on a bar on the right side. As is also seen from FIG. 6A, because of the property of max $(x_1, x_2)^2$ included in the transformation of formula (1), the code according to the present invention has a bit length that is approximately linear to the squares of the integer values $x_1$ and $x_2$ respectively. Note that FIG. 6B illustrates the number of bits of the code along a broken line a in FIG. 6A.

On the other hand, an ideal method for assigning a bit length that minimizes an average code length with respect to an integer sequence that follows a Gaussian distribution of a discrete system:

$$p_2(x) = \frac{1}{Z_2} \cdot \frac{1}{2^{x^2}} \left( Z_2 = \sum_{k=0}^{\infty} \frac{1}{2^{k^2}} \right) \quad (7)$$

is $(x^2+\log_2 Z_2)$ bits, which is a value obtained by taking a negative logarithmic value of 2 with respect to a probability of each integer value x included in the integer sequence, and this has a linear relationship with the square of the integer value x. Therefore, the code according to the present invention corresponds to approximating assignment of an optimum bit length to an integer sequence that follows a Gaussian distribution of a discrete system. As shown in Table 4, the result of actually conducting an experiment of encoding random numbers following a Gaussian distribution shows that the code according to the present invention changes only by a maximum of 3.5% from the bit length of a theoretical limit and the code according to the present invention exhibits performance close to the bit length of the theoretical limit.

TABLE 4

Expected bit length of code with respect to integer value following $p_2(x)$

| Code | Expected bit length (bits/sample) |
|---|---|
| PCM (fixed length binary notation) | 3.0 |
| Golomb-Rice code | 1.403281023 |
| Optimum one-dimensional Huffman code (number of codes: 5) | 1.403281023 |
| Optimum two-dimensional Huffman code (number of codes: 25) | 1.174826457 |
| Code according to invention | 1.176306216 |
| Theoretical limit | 1.136460476 |

Next, a configuration of a code suitable for an integer sequence following a sparser distribution than a Laplacian distribution will be described. The "sparser distribution" here refers to a distribution having a low appearance probability of small integer values and having a high appearance probability of large integer values. To have an optimum code configuration for such a distribution, the present invention first transforms an integer value x as shown in formula (8), obtains a set of integer values $(y_1, y_2)$ and assigns one code at a time, to the obtained integer values $y_1$ and $y_2$.

$$\text{if } x - \lfloor \sqrt{x} \rfloor^2 \text{ is even} \quad (8)$$
$$y_1 = \lfloor \sqrt{x} \rfloor$$
$$y_2 = \frac{(x - \lfloor \sqrt{x} \rfloor^2)}{2}$$
otherwise
$$y_1 = \frac{(x - \lfloor \sqrt{x} \rfloor^2 - 1)}{2}$$
$$y_2 = \lfloor \sqrt{x} \rfloor$$

Here, in formula (8), $$\lfloor \sqrt{x} \rfloor$$

is a flooring function of the square root of x, that is, a largest integer not exceeding the square root of x. A transformation of formula (8) is intended to transform one integer value into a set of two integer values through bijective mapping, a set of integer values $(y_1, y_2)$ is uniquely determined from one integer value x, and the opposite of this, that is, a transformation from the set of integer values $(y_1, y_2)$ to one integer value x is also uniquely determined, and so an inverse transformation is possible on the decoding side. By assigning a Golomb-Rice code to each of the transformed integer values $y_1$ and $y_2$, it is possible to shorten the bit length of the code with respect to large integer values and assign a code suitable for integer values belonging to a sparse distribution. Table 5 shows examples of codes according to the present invention when Rice parameter r=0.

TABLE 5

| Integer value x | Binary notation | Code (r = 0) |
|---|---|---|
| 0 | 0000 | 11 ($y_1 = 0, y_2 = 0$) |
| 1 | 0001 | 011 ($y_1 = 1, y_2 = 0$) |
| 2 | 0010 | 101 ($y_1 = 0, y_2 = 1$) |
| 3 | 0011 | 0101 ($y_1 = 1, y_2 = 1$) |
| 4 | 0100 | 0011 ($y_1 = 2, y_2 = 0$) |
| 5 | 0101 | 1001 ($y_1 = 0, y_2 = 2$) |
| 6 | 0110 | 00101 ($y_1 = 2, y_2 = 1$) |
| 7 | 0111 | 01001 ($y_1 = 1, y_2 = 2$) |
| 8 | 1000 | 001001 ($y_1 = 2, y_2 = 2$) |
| 9 | 1001 | 00011 ($y_1 = 3, y_2 = 0$) |
| . . . | . . . | . . . |

Figure 7:
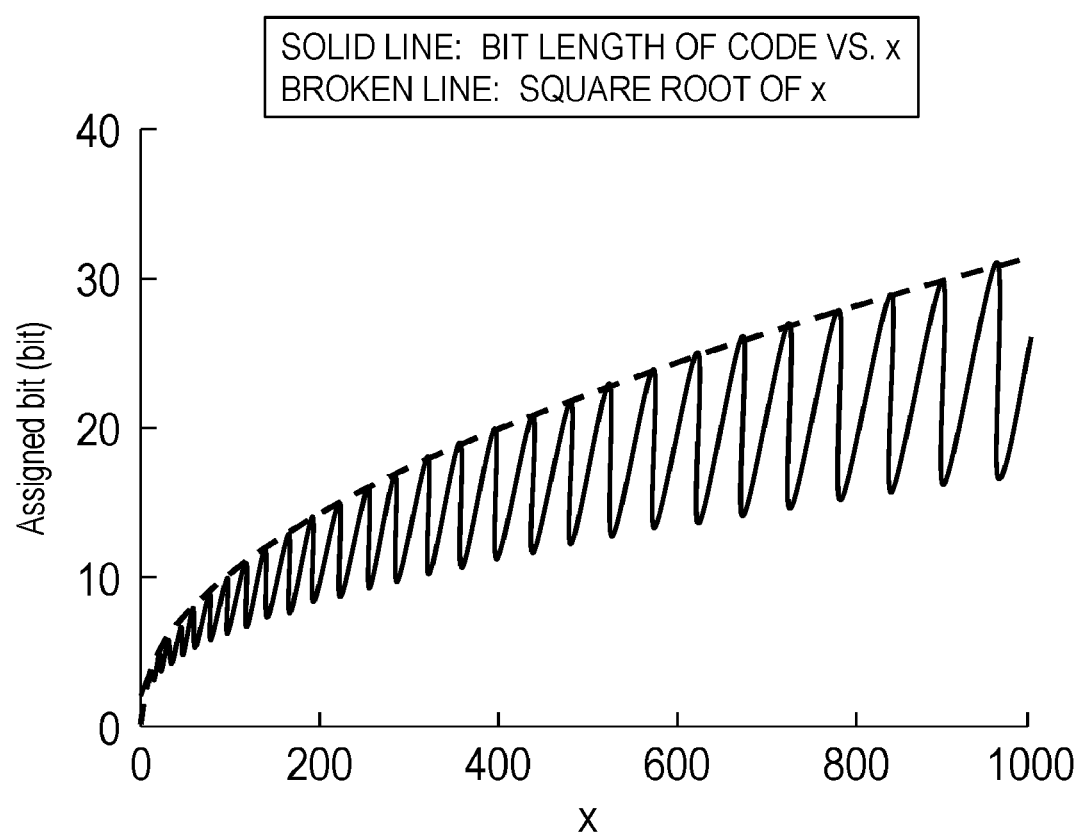
FIG. 7 is a diagram illustrating a bit length of a code corresponding to a set of two integer values.

The integer values $y_1$ and $y_2$ obtained from formula (8) approximately represent the square root values of the original integer value x. Therefore, as shown in FIG. 7, the bit length of the code assigned to the integer value x can be set to a length approximately linearly related to the square root of the integer value x.

On the other hand, an ideal method of assignment of the bit length for which the average code length becomes minimum for an integer sequence that follows:

$$p_{0.5}(x) = \frac{1}{Z_{0.5}} \cdot \frac{1}{2^{x^{0.5}}} \left( Z_{0.5} = \sum_{k=0}^{\infty} \frac{1}{2^{k^{0.5}}} \right) \quad (9)$$

which is a sparser distribution than a Laplacian distribution is $\sqrt{x}+\log_2 Z_{0.5}$ bits, which is a value obtained by taking a negative logarithmic value of 2 with respect to the probability of each integer value x included in the integer sequence and this is linearly related to the square root of the integer value x. Therefore, the code according to the present invention corresponds to approximating assignment of an optimum bit length to an integer sequence following a distribution $p_{0.5}(x)$ of the present invention. As shown in Table 6, the result of actually conducting an experiment of encoding random numbers following a distribution $p_{0.5}(x)$ shows that the code according to the present invention changes only by a maximum of 5% from the bit length of a theoretical limit and the code according to the present invention exhibits performance close to the bit length of the theoretical limit.

TABLE 6

Expected bit length of code with
respect to integer value following $p_{0.5}(x)$

| Code | Expected bit length (bits/sample) |
|---|---|
| PCM (fixed length binary notation) | 8.0 |
| Golomb-Rice code | 11.79336745 |
| Optimum one-dimensional Huffman code (number of codes: 5) | 4.762629635 |
| Code according to invention | 4.968605871 |
| Theoretical limit | 4.732577773 |

Although a case with Rice parameter r=0 has been described in the above example, it is possible to assign a code corresponding to the Rice parameter to the respective integer values also in cases other than r=0 using a method similar to that in the prior art.

Second Embodiment

<<Encoder>>

A processing procedure for an encoding method executed by an encoder according to a second embodiment will be described with reference to FIG. 2 and FIG. 3. As in the case of the encoder of the first embodiment, the encoder of the second embodiment is provided with, for example, an integer transformer 13 and an integer encoder 14. The encoder of the second embodiment obtains two integer values through algebraically-representable bijective transformation for each integer value in the inputted sequence of integer values, variable-length encodes the obtained sequence of integer values and thereby implements an encoding process with a shorter bit length than Golomb-Rice encoding for integer sequences with a sparser distribution than a Laplacian distribution.

[Integer Transformer 13]

N samples (N is a natural number) of the sequence of integer values inputted to the encoder are inputted at a time to the integer transformer 13. It is assumed that the inputted sequence of integer values is an integer sequence $x\_1, x\_2, \ldots, x\_N$. The integer transformer 13 obtains two integer values for the respective integer values in the inputted integer sequence $x\_1, x\_2, \ldots, x\_N$ through algebraically-representable bijective transformation and outputs the obtained sequence of 2N integer values $y\_1, y\_2, \ldots, y\_2N$ to the integer encoder 14 as a transformed integer sequence (step S13). As the method for obtaining two integer values for the respective integer values through algebraically-representable bijective transformation, for example, a method in which two integer values $y_1$ and $y_2$ are obtained according to above formula (8) is used, where x is a respective integer value in the integer sequence $x\_1, x\_2, \ldots, x\_N$. Then, values obtained by arranging a total of 2N integer values according to formula (8) in predetermined order are outputted as a transformed integer sequence $y\_1, y\_2, \ldots, y\_2N$. The integer transformer 13 may perform, for example, the following procedure in Steps B-1 to B-3-1 or Steps B-1, B-2 and B-3-2 instead of the calculation of the formula (8).

Step B-1: Acquire largest integer c not exceeding square root of x.

Step B-2: Find square ($c^2$) of c.

Step B-3-1: When the difference between x and the square of c is an even number, that is, when $x-c^2$ is an even number, assuming that c is an integer value $y_1$, a value obtained by subtracting the square of c from x is divided by 2 to obtain a value $(x-c^2)/2$ as an integer value $y_2$.

Step B-3-2: When the difference between x and the square of c is an odd number, that is, when $x-c^2$ is an odd number, assuming that c is an integer value $y_2$, a value obtained by subtracting the square of c plus 1 from x is divided by 2 to obtain a value $(x-c^2-1)/2$ as an integer value $y_1$.

Here, the predetermined order is order in which values can be stored in the encoder and the decoder in advance, for example, such as order in which two transformed integers obtained from integer value $x\_1$ are assumed to be $y\_1$ and $y\_2$, two transformed integers obtained from integer value $x\_2$ are assumed to be $y\_3$ and $y\_4, \ldots$, two transformed integers obtained from integer value $x\_N$ are assumed to be $y\_2N-1$ and $y\_2N$.

[Integer Encoder 14]

A transformed integer sequence $y\_1, y\_2, \ldots, y\_2N$ outputted by the integer transformer 13 is inputted to the integer encoder 14. The integer encoder 14 Golomb-Rice encodes each integer value included in the transformed integer sequence $y\_1, y\_2, \ldots, y\_2N$, that is, obtains Golomb-Rice codes $C\_1, C\_2, \ldots, C\_2N$ respectively for the respective integer values with a predetermined Rice parameter r and outputs a code group of the obtained codes as an integer code (step S14).

Note that the predetermined Rice parameter r may be predetermined and stored in the encoder and the decoder in advance or, for example, the integer encoder 14 may perform Golomb-Rice encoding using the same Rice parameter r for each transformed integer sequence $y\_1, y\_2, \ldots, y\_2N$ and output the code corresponding to the Rice parameter r used for Golomb-Rice encoding added to the Golomb-Rice codes $C\_1, C\_2, \ldots, C\_2N$ as an integer code.

<<Decoder>>

A processing procedure for a decoding method executed by a decoder according to the second embodiment will be described with reference to FIG. 4 and FIG. 5. As in the case of the decoder of the first embodiment, the decoder of the second embodiment is provided with, for example, an integer decoder 23 and an integer inverse transformer 24. An integer code outputted by the encoder of the second embodiment is inputted to the decoder of the second embodiment. The decoder of the second embodiment decodes an inputted integer code through a decoding process corresponding to the encoder of the second embodiment to thereby obtain a sequence of integer values, obtains one integer value through transformation inverse to that of the encoder of the second embodiment for each set of two integer values in the obtained sequence of integer values and thereby reconstructs the sequence itself of integer values inputted to the encoder of the second embodiment.

[Integer Decoder 23]

2N (N is a natural number) integer codes inputted to the decoder are inputted at a time to the integer decoder 23. It is assumed here that the inputted integer codes are $C\_1, C\_2, \ldots, C\_2N$. The integer decoder 23 Golomb-Rice decodes each inputted integer code $C\_1, C\_2, \ldots, C\_2N$, that is, obtains integer values $y\_1, y\_2, \ldots, y\_2N$ from each integer code $C\_1, C\_2, \ldots, C\_2N$ respectively, which is a Golomb-Rice code with a predetermined Rice parameter r and outputs the obtained sequence of integer values to the integer inverse transformer 24 as a transformed integer sequence $y\_1, y\_2, \ldots, y\_2N$ (step S23). As the predetermined Rice parameter r, one similar to that of the corresponding encoder is used. That is, a Rice parameter r which is predetermined stored in the decoder in advance may be used or a Rice parameter r obtained by decoding the code corresponding to the Rice parameter r included in the integer code may be used.

[Integer Inverse Transformer 24]

The transformed integer sequence y_1, y_2, ..., y_2N outputted by the integer decoder 23 is inputted to the integer inverse transformer 24. The integer inverse transformer 24 obtains N sets of two integer values according to a rule corresponding to the rule carried out by the integer transformer 13 of the encoder according to the second embodiment from the inputted transformed integer sequence y_1, y_2, ..., y_2N, performs transformation inverse to that performed by the integer transformer 13 of the encoder of the second embodiment for each of the obtained integer sets to obtain one integer value and outputs an integer sequence x_1, x_2, ..., x_N which is the obtained sequence of integer values (S S24).

When the integer transformer 13 of the encoder of the second embodiment performs transformation in formula (8), the integer inverse transformer 24 obtains one integer value x from the set of two integer values $(y_1, y_2)$ according to formula (10) as transformation inverse to that in formula (8).

$$x = \max(y_1, y_2)^2 + 2\min(y_1, y_2) + d \begin{cases} \text{if } y_1 < y_2 & d = 1 \\ \text{otherwise} & d = 0 \end{cases} \quad (10)$$

When the rule carried out by the integer transformer 13 of the encoder of the second embodiment is a rule that two adjacent transformed integers are assumed to be an integer set, the integer inverse transformer 24 obtains an integer value x_1 from the transformed integers y_1 and y_2 of the inputted transformed integer sequence y_1, y_2, ..., y_2N, obtains an integer value x_2 from the transformed integers y_3 and y_4, obtains an integer value x_N from the transformed integers y_2N−1 and y_2N and outputs an integer sequence x_1, x_2, ..., x_N, which is the obtained sequence of integer values.

Modifications of First Embodiment and Second Embodiment

The transformation in formula (1) performed by the integer transformer 11 of the encoder of the first embodiment can also be approximated by operation with binary notation. For example, when the values of $x_1$ and $x_2$ are expressed as "1111" in binary notation ("15" in decimal notation) and "0000" ("0" in decimal notation) respectively, "10101010" ("170" in decimal notation) in which these digits are nested approximately indicates a value close to the square of $x_1$ or $x_2$. Therefore, the integer transformer 11 of the encoder of the first embodiment may use a value obtained through operation of nesting the digits in binary notation of the values of $x_1$ and $x_2$ as y. Here, the operation of nesting the digits refers to operation in which the numerical value of the most significant bit of $x_1$ in binary notation may be assumed to be the numerical value of the most significant bit of y in binary notation, the numerical value of the most significant bit of $x_2$ in binary notation may be assumed to be the numerical value of the second digit from the most significant bit of y in binary notation, ..., the numerical value of the least significant bit of $x_1$ in binary notation may be assumed to be the numerical value of the second digit from the least significant bit of y in binary notation, and the numerical value of the least significant bit of $x_2$ in binary notation may be assumed to be the numerical value of the least significant bit of y in binary notation, and the operation will also be referred to as "nesting processing" hereinafter. When the integer transformer 11 of the encoder of the first embodiment performs the operation of nesting the digits in binary notation, the integer inverse transformer 22 of the decoder of the first embodiment may perform operation inverse to the nesting processing, that is, operation in which the numerical value of the most significant bit of y in binary notation is assumed to be the numerical value of the most significant bit of $x_1$ in binary notation, the numerical value of the second digit from the most significant bit of y in binary notation is assumed to be the numerical value of the most significant bit of $x_2$ in binary notation, ..., the numerical value of the second digit from the least significant bit of y in binary notation is assumed to be the numerical value of the least significant bit of $x_1$ in binary notation and the numerical value of the least significant bit in binary notation of y is assumed to be the numerical value of the least significant bit of $x_2$ in binary notation.

Similarly, the integer transformer 13 of the encoder of the second embodiment may also assume two integer values obtained by performing operation inverse to the nesting processing in binary notation of the value of x as $y_1$ and $y_2$, and in this case, the integer inverse transformer 24 of the decoder of the second embodiment may perform the operation of nesting the digits in binary notation of the values of y, and $y_2$ to obtain an integer value x.

Third Embodiment

The encoder of the first embodiment obtains one integer value through algebraically-representable bijective transformation on each set of two integer values in an inputted sequence of integer values, and by obtaining one integer value through algebraically-representable bijective transformation on each set of more integer values in the inputted sequence of integer values, it is possible to assign a more appropriate code to a sequence of integer values following a denser distribution. In a third embodiment, one integer value is obtained through algebraically-representable bijective transformation on each set of predetermined M (M is an integer equal to or greater than 2) integer values in an inputted sequence of integer values, and the obtained sequence of integer values is variable-length encoded. Note that when M is 2, operation of the third embodiment is the same as the operation of the first embodiment.

<<Encoder>>

A processing procedure for an encoding method executed by an encoder of the third embodiment will be described with reference to FIG. 2 and FIG. 3. As in the case of the encoder of the first embodiment, the encoder of the third embodiment is provided with, for example, an integer transformer 15 and an integer encoder 16. Since operation of the integer encoder 16 of the encoder of the third embodiment and a process in step S16 executed by the integer encoder 16 are the same as the operation of the integer encoder 12 of the encoder of the first embodiment and the process in step S12 executed by the integer encoder 12, only the integer transformer 15, operation of which is different from the first embodiment will be described.

[Integer Transformer 15]

A sequence of integer values of MN samples (M×N samples, M is an integer equal to or greater than 2, N is a natural number) of the sequence of integer values inputted to the encoder is inputted at a time to the integer transformer 15. The inputted sequence of integer values is assumed to be an integer sequence x_1, x_2, ..., x_MN. The integer transformer 15 obtains N sets of M integer values from the inputted integer sequence x_1, x_2, ..., x_MN according to a predetermined rule, obtains one integer value through algebraically-representable bijective transformation for the respective integer sets and outputs the obtained sequence of N integer values y_1, y_2, . . . , y_N to the integer encoder 16 (step S15). As the method for obtaining one integer value through algebraically-representable bijective transformation for the respective integer sets, for example, a method for obtaining one integer value y according to formula (11) assuming that M integer values making up an integer set are $x_1, x_2, \ldots, x_M$ is used. Hereinafter, a sequence y_1, y_2, . . . , y_N will be referred to as a "transformed integer sequence."

$$y = f_M(x_1, x_2, \ldots, x_M) \quad (11)$$

However, assuming that $f_{M'}(x_1, x_2, \ldots, x_{M'})$ receives a sequence (variable sequence) $x_1, x_2, \ldots, x_{M'}$ of M' variables as input, which is a recursive function having one variable as output, a maximum value of M' variables $x_1, x_2, \ldots, x_{M'}$ is $x_{max}$, the number of variables that take maximum values is K, numbers of K variables that take maximum values within the variable sequence are $m_1, m_2, \ldots, m_K$ respectively, a sequence of (M'−K) variables obtained by excluding the variables that take maximum values from the variable sequence $x_1, x_2, \ldots, x_{M'}$ is $\bar{x}_1, \bar{x}_2, \ldots, \bar{x}_{M'-K}$, $f_0$ is 0, and $_{M'}C_K$ is the number of combinations for selecting K variables from M' variables, the above-described function can be expressed as formula (12):

$$f_{M'}(x_1, x_2, \ldots, x_{M'}) = \sum_{m=0}^{K-1} {}_{M'}C_m x_{max}^{M'-m} + {}_{M'}C_K f_{M'-K}(\bar{x}_1, \bar{x}_2, \ldots, \bar{x}_{M'-K}) + \sum_{i=0}^{K-1} {}_{M'-m_{i+1}}C_{K-i} \quad (12)$$

The predetermined rule for obtaining N integer sets can be any rule such as a rule that M adjacent integer values within the inputted integer sequence x_1, x_2, . . . , x_MN are assumed to be integer sets, that is, x_1 to x_M, x_M+1 to x_2M, . . . , x_M(N−1)+1 to x_MN are assumed to be integer sets as long as such a rule can be predetermined and stored in the encoder and the decoder in advance.

In the case of the rule that M adjacent integer values are assumed to be an integer set, the integer transformer 15 obtains a transformed integer y_1 from the integer set of x_1 to x_M of the inputted integer sequence x_1, x_2, . . . , x_MN, obtains a transformed integer y_2 from the integer set of x_M+1 to x_2M, . . . , obtains a transformed integer y_N from the integer set of x_M(N−1)+1 to x_MN, and outputs the transformed integer sequence y_1, y_2, . . . , y_N, which is the obtained sequence of transformed integers.

Note that as in the case of the modification of the encoder of the first embodiment, the integer transformer 15 may execute, for example, the following procedure in Steps C-1 and C-2 instead of the calculation of formula (11).

Step C-1: M integer values are assumed to be $x_1, x_2, \ldots, X_M$, the maximum number of digits thereof in binary notation is assumed to be K, and numerical values of the respective digits of $x_i$ in binary notation are assumed to be a_(K, i), a_(K−1, . . . a_(1, i) respectively. That is, a_(k, i) represents a value of a k (k=1, 2, . . . , K)-th digit of $x_i$(i=1, 2, . . . , M) and a_(k, i) is 0 or 1.

Step C-2: An integer with MK digits (M×K digits): a maximum number of digits in which M values of each digit are arranged in order from the most significant bit to the least significant bit is assumed to be a binary notation of transformed integer y. That is, an integer, binary notation of which is a_(K, M), a_(K, M−1), . . . , a_(K, 1), a_(K−1, M), . . . , a_(K−1, 1), . . . , a_(1, 1) is assumed to be a transformed integer y.

<<Decoder>>

A processing procedure for a decoding method executed by a decoder of the third embodiment will be described with reference to FIG. 4 and FIG. 5. As in the case of the decoder of the first embodiment, the decoder of the third embodiment is provided with, for example, an integer decoder 25 and an integer inverse transformer 26. Since operation of the integer decoder 25 of the decoder of the third embodiment and a process in step S25 executed by the integer decoder 25 are the same as the operation of the integer decoder 21 of the decoder of the first embodiment and the process in step S21 executed by the integer decoder 21, only the integer inverse transformer 26, operation of which is different from that of the first embodiment will be described.

[Integer Inverse Transformer 26]

A transformed integer sequence y_1, y_2, . . . , y_N outputted by the integer decoder 25 is inputted to the integer inverse transformer 26. The integer inverse transformer 26 performs transformation inverse to that performed by the integer transformer 15 of the encoder of the third embodiment on the respective integer values included in the inputted transformed integer sequence y_1, y_2, . . . , y_N, obtains N integer sets of M integer values, obtains and outputs an integer sequence x_1, x_2, . . . , x_MN according to a rule corresponding to the rule carried out by the integer transformer 15 of the encoder of the third embodiment from the obtained N integer sets (step S26).

When the integer transformer 15 of the encoder of the third embodiment performs transformation in formula (11), the integer inverse transformer 26 obtains M integer values $x_1, x_2, \ldots, X_M$ from one integer value y according to formula (13) as transformation inverse to that in formula (11).

$$(x1, x_2, \ldots, x_M) = f_M^{-1}(y) \quad (13)$$

Where, $f_{M'}^{-1}(y)$ is a recursive function, input of which consists of one variable and output of which consists of M' variables, and using a maximum M'-th order square root not exceeding y:

$$\lfloor \sqrt[M']{y} \rfloor$$

and
a maximum K for which $$y - \sum_{m=0}^{K-1} {}_{M'}C_m \lfloor \sqrt[M']{y} \rfloor^{M'-m}$$

is not less than 0, and
a variable sequence $\bar{x}_1, \bar{x}_2, \ldots, \bar{x}_{M'-K}$ consisting of (M'−K) variables given by:

$$f_{M'-K}^{-1}\left(\left[\left(y - \sum_{m=0}^{K-1} {}_{M'}C_m \lfloor \sqrt[M']{y} \rfloor^{M'-m}\right) / {}_{M'}C_K\right]\right)$$

and
$\lambda_{M'}$ which is a remainder of dividing $$y - \sum_{m=0}^{K-1} {}_{M'}C_m \lfloor \sqrt[M']{y} \rfloor^{M'-m}$$

by $_{M'}C_K$ and calculates formula (14) using $i_1=0$ and $i_2=0$ as initial values respectively with respect to m=0 to m=M'−1, thereby obtains and outputs M' integer values $x_1, x_2, \ldots, x_{M'}$.

$$\text{if } \lambda_{M'} \geq {}_{M'-m-1}C_{K-i_1} \quad (14)$$
$$x_{m+1} = \lfloor \sqrt[M']{y} \rfloor$$
$$\lambda_{M'} = \lambda_{M'} - {}_{M'-m-1}C_{K-i_1}$$
$$i_1 = i_1 + 1$$
$$\text{otherwise}$$
$$x_{m+1} = \tilde{x}_{i_2+1}$$
$$i_2 = i_2 + 1$$

Furthermore, $f_0^{-1}(y)$ means a function that outputs nothing.

Note that as in the case of the modification of the decoder of the first embodiment, the integer inverse transformer 26 may perform, for example, the following procedure in Steps D-1 and D-2 instead of the calculation in formula (12).

Step D-1: The values of the respective digits of the MK digits of the inputted transformed integer y in binary notation are assumed to be a_(MK), a_(MK−1), . . . , a_(1) respectively.

Step D-2: Integers obtained by extracting and arranging K integer values every other M integer values from the sequence a_(MK), a_(MK−1), . . . , a_(1) of MK values obtained in above Step D-1 are arranged and assumed to be M integer values $x_1, x_2, \ldots, x_M$. That is, an integer whose binary notation is a_(M(K−1)+1), a_(M(K−2)+1), . . . , a_(1) is assumed to be $x_1$, an integer whose binary notation is a_(M(K−1)+2), a_(M(K−2)+2), . . . , a_(2) is assumed to be $x_2, \ldots$, and an integer whose binary notation is a_(MK), a_(M(K−1)), . . . , a_(M) is assumed to be $x_M$.

When the rule carried out by the integer transformer 15 of the encoder of the third embodiment is a rule that M adjacent integer values are assumed to be an integer set, the integer inverse transformer 26 obtains integer sets of integer values x_1 to x_M from the transformed integer y_1 of the inputted transformed integer sequence y_1, y_2, . . . , y_N, obtains integer sets of integer values x_M+1 to x_2M from the transformed integer y_2, . . . , obtains integer sets of integer values x_M(N−1)+1 to x_MN from the transformed integer y_N, and outputs an integer sequence x_1, x_2, . . . , x_MN, which is the obtained sequence of integer sets.

<<Operations and Effects>>

According to the third embodiment, the larger the value of M, the further it is possible to implement a encoding process with a bit length shorter than that of Golomb-Rice encoding and a decoding process corresponding to the encoding process for a sequence of integer values having a denser distribution than the Laplacian distribution.

Fourth Embodiment

The encoder of the second embodiment obtains two integer values through algebraically-representable bijective transformation for each one integer value in the inputted sequence of integer values, and by obtaining more integer values through algebraically-representable bijective transformation for each one integer value in the inputted sequence of integer values, the encoder can assign an appropriate code to a sequence of integer values following a sparser distribution. A fourth embodiment obtains predetermined M (M is an integer equal to or greater than 2) integer values through algebraically-representable bijective transformation for one integer value in the inputted sequence of integer values and variable-length encodes the obtained sequence of integer values. Note that operation of the fourth embodiment when M is 2 is the same as the operation of the second embodiment.

<<Encoder>>

A processing procedure for an encoding method executed by an encoder of the fourth embodiment will be described with reference to FIG. 2 and FIG. 3. As in the case of the encoder of the first embodiment, the encoder of the fourth embodiment is provided with, for example, an integer transformer 17 and an integer encoder 18.

[Integer Transformer 17]

A sequence of integer values consisting of N samples (N is a natural number) of the sequence of integer values inputted to the encoder is inputted to the integer transformer 17. The inputted sequence of integer values is assumed to be an integer sequence x_1, x_2, . . . , x_N. The integer transformer 17 obtains M integer values through algebraically-representable bijective transformation for respective integer values in the inputted integer sequence x_1, x_2, . . . , x_N and outputs a sequence y_1, y_2, . . . , y_MN obtained by arranging the obtained MN integer values in predetermined order to the integer encoder 18 as a transformed integer sequence (step S17). As the method for obtaining M integer values through algebraically-representable bijective transformation for the respective integer values, for example, a method of obtaining M integer values $y_1, y_2, \ldots, y_M$ according to formula (15) assuming the respective integer values in the integer sequence x_1, x_2, . . . , x_N as x is used.

$$(y_1, y_2, \ldots, y_M) = g_M(x) \quad (15)$$

where, $g_{M'}(x)$ is a recursive function, input of which consists of one variable and output of which consists of M' variables, and using a maximum M'-th order square root not exceeding x:

$$\lfloor \sqrt[M']{x} \rfloor$$

and
a maximum K for which $$x - \sum_{m=0}^{K-1} {}_{M'}C_m \lfloor \sqrt[M']{x} \rfloor^{M'-m}$$

is not less than 0, and
a variable sequence $\bar{y}_1, \bar{y}_2, \ldots, \bar{y}_{M-K}$ consisting of (M'−K) variables given by:

$$g_{M'-K}\left(\left(x - \sum_{m=0}^{K-1} {}_{M'}C_m \lfloor \sqrt[M']{x} \rfloor^{M'-m}\right) \Big/ {}_{M'}C_K\right)$$

and
$\lambda_{M'}$ which is a remainder of dividing $$x - \sum_{m=0}^{K-1} {}_{M'}C_m \lfloor \sqrt[M']{x} \rfloor^{M'-m}$$

by $_{M'}C_K$ and calculates formula (16) using $i_1=0$ and $i_2=0$ as initial values respectively with respect to m=0 to m=M'−1, thereby obtains and outputs M' integer values $y_1$, $y_2, \ldots, y_{M'}$.

$$\text{if } \lambda_{M'} \geq_{M'-m-1} C_{K-i_1} \tag{16}$$
$$y_{m+1} = \lfloor \sqrt[M']{x} \rfloor$$
$$\lambda_{M'} = \lambda_M -_{M'-m-1} C_{K-i_1}$$
$$i_1 = i_1 + 1$$
otherwise
$$y_{m+1} = \tilde{y}_{i_2+1}$$
$$i_2 = i_2 + 1$$

Furthermore, $g_o(x)$ means a function that outputs nothing.

Note that as in the case of the modification of the encoder of the second embodiment, the integer transformer 17 may perform, for example, the following procedure in Steps E-1 and E-2 instead of the calculation in formula (15).

Step E-1: The values of the respective digits of the MK digits of the inputted integer x in binary notation are assumed to be a_(MK), a_(MK−a1), ..., a_(1) respectively.

Step E-2: Integers obtained by extracting and arranging K values every other M integer values from a sequence a_(MK), a_(MK−1), ..., a_(1) of MK values obtained in above Step E-1 are assumed to be M integer values $y_1, y_2, \ldots, y_M$. That is, an integer whose binary notation is a_(M(K−1)+1), a_(M(K−2)+1), ..., a_(1) is assumed to be $y_1$, an integer whose binary notation is a_(M(K−1)+2), a_(M(K−2)+2), ..., a_(2) is assumed to be $y_2$, ..., and an integer whose binary notation is a_(MK), a_(M(K−1)), ..., a_(M) is assumed to be $y_M$.

Here, the "predetermined order" refers to order to be stored in the encoder and the decoder in advance, for example, M transformed integers obtained from the integer value x_1 are assumed to be y_1 to y_M, M transformed integers obtained from the integer value x_2 are assumed to be y_M+1 to y_2M, ..., M transformed integers obtained from the integer value x_N are assumed to be y_M(N−1)+1 to y_MN.

[Integer Encoder 18]

The transformed integer sequence y_1, y_2, ..., y_MN outputted by the integer transformer 17 is inputted to the integer encoder 18. The integer encoder 18 Golomb-Rice encodes each integer value included in the transformed integer sequence y_1, y_2, ..., y_MN, obtains Golomb-Rice codes C_1, C_2, ..., C_MN and outputs a code group of the obtained codes as an integer code (step S18). Operation of the integer encoder 18 is similar to the operation of the integer encoder 14 of the encoder according to the second embodiment except in that the respective integer values to be Golomb-Rice encoded are 2N integer values of the transformed integer sequence y_1, y_2, ..., y_2N in the integer encoder 14 of the encoder of the second embodiment, whereas they are MN integer values of the transformed integer sequence y_1, y_2, ..., y_MN.

<<Decoder>>

A processing procedure for a decoding method executed by a decoder of the fourth embodiment will be described with reference to FIG. 4 and FIG. 5. As in the case of the decoder of the first embodiment, the decoder of the fourth embodiment is provided with, for example, an integer decoder 27 and an integer inverse transformer 28.

[integer Decoder 27]

MN (M is an integer equal to or greater than 2, N is a natural number) integer codes inputted to the decoder are inputted at a time to the integer decoder 27. Here, the inputted integer codes are assumed to be C_1, C_2, ..., C_MN. The integer decoder 27 Golomb-Rice decodes the respective inputted integer codes C_1, C_2, ..., C_MN, obtains integer values y_1, y_2, ..., y_MN and outputs the obtained sequence of integer values to the integer inverse transformer 28 as a transformed integer sequence y_1, y_2, ..., y_MN (step S27). Operation of the integer decoder 27 is similar to the operation of the integer decoder 23 of the decoder of the second embodiment except in that the sequence of respective integer values obtained by Golomb-Rice decoding the integer values is the transformed integer sequence y_1, y_2, ..., y_2N with 2N integer values in the integer decoder 23 of the decoder of the second embodiment, whereas they are transformed integer sequence y_1, y_2, ..., y_MN with the MN integer values.

[Integer Inverse Transformer 28]

The transformed integer sequence y_1, y_2, ..., y_MN outputted by the integer decoder 27 is inputted to the integer inverse transformer 28. The integer inverse transformer 28 obtains N integer sets of M integer values according to a rule corresponding to the rule carried out by the integer transformer 17 of the encoder of the fourth embodiment from the inputted transformed integer sequence y_1, y_2, ..., y_MN, performs transformation inverse to that performed by the integer transformer 17 of the encoder of the fourth embodiment for each of the obtained integer sets, thereby obtains one integer value and outputs an integer sequence x_1, x_2, ..., x_N which is the obtained sequence of integer values (step S28).

When the integer transformer 17 of the encoder of the fourth embodiment performs the transformation in formula (15), the integer inverse transformer 28 obtains one integer value x from a set of M integer values $(y_1, y_2, \ldots, y_M)$ according to formula (17) as transformation inverse to that in formula (15).

$$x = g_M^{-1}(y_1, y_2, \ldots, y_M) \tag{17}$$

where when it is assumed that $g_{M'}^{-1}(y_1, y_2, \ldots, y_{M'})$ is a recursive function, input of which consists of a sequence of M' variables (variable sequence) and output of which consists of one variable, a maximum value of M' variables $y_1, y_2, \ldots, y_{M'}$ is $y_{max}$, the number of variables that take maximum values is K, numbers of the respective K variables that take maximum values within the variable sequence are $m_1, m_2, \ldots, m_K$, a sequence of (M'−K) variables obtained by excluding variables taking maximum values from the variable sequence $y_1, y_2, \ldots, y_{M'}$ is $\tilde{y}_1, \tilde{y}_2, \ldots, \tilde{y}_{M'-K}$, $g_0^{-1}$ is 0, $_{M'}C_K$ is the number of combinations for selecting K variables from M' variables, the above-described function can be expressed as formula (18).

$$g_{M'}^{-1}(y_1, y_2, \ldots, y_{M'}) = \sum_{m=0}^{K-1} {}_{M'}C_m y_{max}^{M'-m} + {}_{M'}C_K g_{M-K}^{-1}(\tilde{y}_1, \tilde{y}_2, \ldots, \tilde{y}_{M'-K}) + \sum_{i=0}^{K-1} {}_{M'-m_{i+1}}C_{K-i} \tag{18}$$

Note that as in the case of the modification of the decoder of the second embodiment, the integer inverse transformer 28 may perform, for example, the following procedure in Steps F-1 and F-2 instead of the calculation in formula (17).

Step F-1: It is assumed that M transformed integers are $y_1, y_2, \ldots, y_M$, a maximum number of digits in binary notation thereof is K, numerical values of the respective digits of $y_i$ in binary notation are $a\_(K, i), a\_(K-1, i), \ldots, a\_(1, i)$ respectively. That is, $a\_(k, i)$ represents a k (k=1, 2, ..., K)-th digit value of y(i=1, 2, ..., M) and $a\_(k, i)$ is 0 or 1.

Step F-2: Integers of a maximum number of digits: MK digits, in which M values of each digit are arranged in order from the most significant bit to the least significant bit are assumed to be binary notation of integer x. That is, an integer whose binary notation is $a\_(K, M), a\_(K, M-1), \ldots a\_(K, 1), a\_(K-1, M), \ldots, a\_(K-1, 1), \ldots, a\_(1, 1)$ is assumed to be an integer x.

When the rule carried out by the integer transformer 17 of the encoder of the fourth embodiment is a rule that M adjacent transformed integers are assumed to be an integer set, the integer inverse transformer 28 obtains integer value x_1 from the transformed integer y_1 to y_M of the inputted transformed integer sequence $y\_1, y\_2, \ldots, y\_MN$, obtains an integer value x_2 from the transformed integers y_M+1 to y_2M, ..., obtains an integer value x_N from the transformed integers y_M(N-1)+1 to y_MN and outputs an integer sequence $x\_1, x\_2, \ldots, x\_N$, which is the obtained sequence of integer values.

<<Operations and Effects>>

According to the fourth embodiment, the larger the value of M, the further it is possible to implement a encoding process with a bit length shorter than that of Golomb-Rice encoding and a decoding process corresponding to the encoding process for a sequence of integer values having a sparser distribution than a Laplacian distribution.

Fifth Embodiment

The encoder may estimate, for each partial sequence in an inputted sequence of integer values, a property of distribution of the sequence, operate by selecting any one of the first embodiment to the fourth embodiment according to the estimated property of distribution or operate by selecting the value of M of the third embodiment or the fourth embodiment according to the estimated property of distribution. Similarly, the decoder may operate by selecting any one of the first embodiment to the fourth embodiment according to an index value representing a property of distribution estimated by the encoder or operate by selecting the value of M of the third embodiment or the fourth embodiment according to an index value representing a property of distribution estimated by the encoder. This embodiment will be described as the fifth embodiment.

<<Encoder>>

Figure 8:
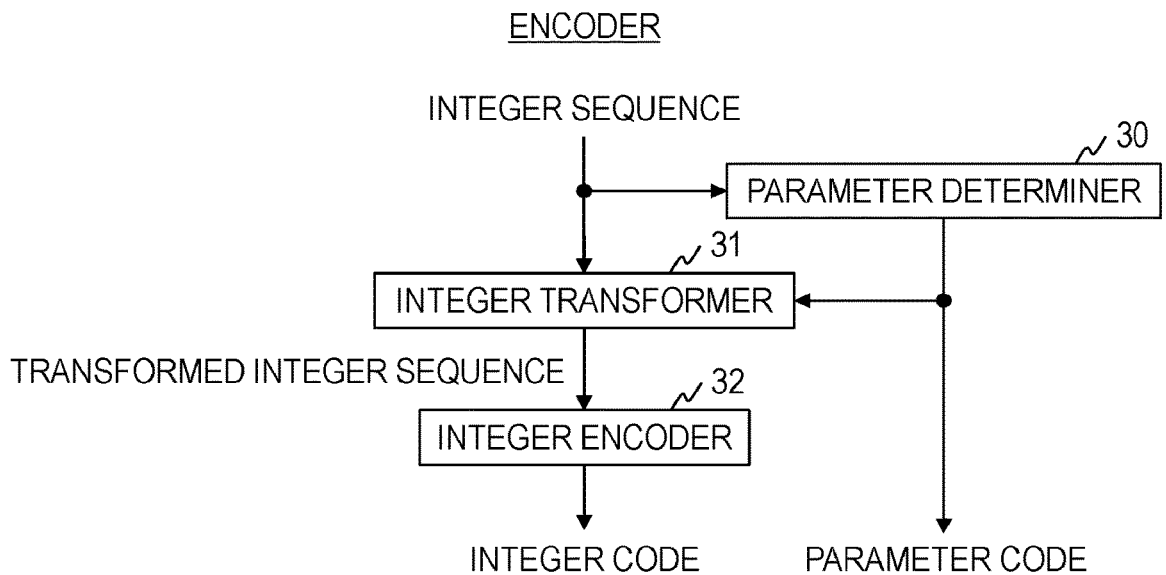
FIG. 8 is a diagram illustrating a functional configuration of an encoder of a fifth embodiment.
Figure 9:
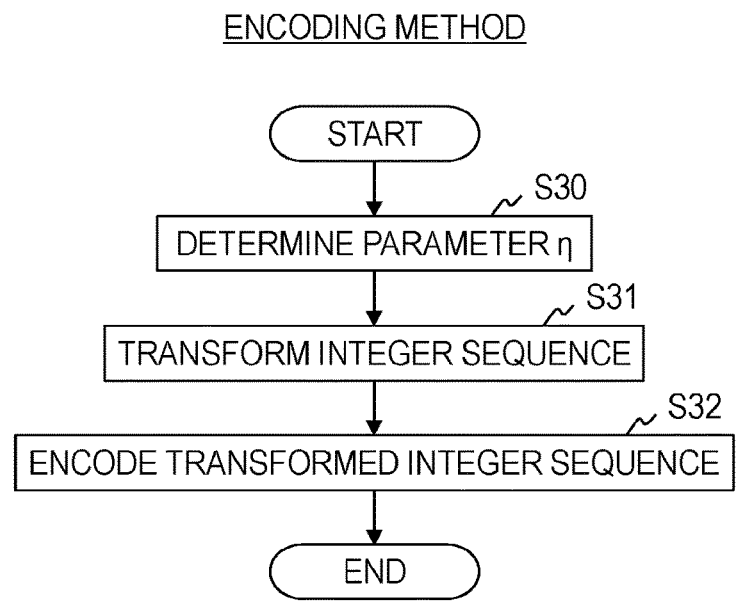
FIG. 9 is a diagram illustrating a processing procedure for an encoding method of the fifth embodiment.

A processing procedure for an encoding method executed by an encoder of the fifth embodiment will be described with reference to FIG. 8 and FIG. 9. As shown in FIG. 8, the encoder according to the fifth embodiment is provided with, for example, a parameter determiner 30, an integer transformer 31 and an integer encoder 32. The encoding method of the fifth embodiment is implemented by the encoder executing a process in each step shown in FIG. 9.

A sequence of integer values is inputted to the encoder of the fifth embodiment. As has also been described in the first embodiment, the sequence of integer values is obtained by quantizing through an existing technique, part or a whole of a signal obtained by transforming voice, music or the like collected using, for example, a microphone into a time-domain or frequency-domain digital signal or a signal obtained by transforming an image or video captured using a camera into a time-domain or frequency-domain digital signal and converting the signal to a finite precision value. A sequence of integer values inputted to the encoder of the fifth embodiment is inputted to the parameter determiner 30 for each sequence of a predetermined number of integer values. The "sequence of the predetermined number of integer values" is a sequence of integer values corresponding to a digital signal for a predetermined time section called a "frame" in the case of, for example, a digital signal such as voice or music. For example, a sequence of integer values of L samples (L is a natural number) is inputted at a time to the parameter determiner 30.

[Parameter Determiner 30]

A sequence of integer values of L samples (L is a natural number) of the sequence of integer values inputted to the encoder is inputted at a time to the parameter determiner 30. The inputted sequence of integer values is assumed to be an integer sequence $x\_1, x\_2, \ldots, x\_L$. The parameter determiner 30 obtains an index value representing a property of distribution of the integer sequence based on the inputted integer sequence $x\_1, x\_2, \ldots, x\_L$ and outputs the obtained index value and a parameter code which is a code representing the index value (step S30). The parameter code may be obtained by encoding the index value so that the decoder may obtain the index value determined by the parameter determiner 30 by decoding the parameter code.

The parameter determiner 30 obtains and outputs a parameter $\eta$, which is an index value representing a property of distribution of the integer sequence from, for example, the inputted integer sequence $x\_1, x\_2, \ldots, x\_L$. More specifically, the parameter determiner 30 regards the $\eta_0$-th power of absolute values of the respective integer values included in the integer sequence $x\_1, x\_2, \ldots, x\_L$ as the respective values of a power sequence using the positive parameter $\eta_0$ determined by a predetermined method, estimates an envelope, obtains a whitened spectral sequence which is a sequence obtained by dividing each integer value included in the integer sequence $x\_1, x\_2, \ldots, x\_L$ by each value of the envelope, obtains a positive parameter $\eta$ with which a generalized Gaussian distribution using the parameter $\eta$ as a shape parameter approximates a histogram of the whitened sequence and outputs the obtained parameter $\eta$ and a parameter code which is a code representing the parameter $\eta$.

That is, when the integer sequence $x\_1, x\_2, \ldots, x\_L$ is obtained by converting the respective sample values of a time-domain digital signal for a predetermined time section to non-negative integer values, the parameter determiner 30 regards the $\eta_0$-th power of absolute values of the respective integer values included in the integer sequence $x\_1, x\_2, \ldots, x\_L$ as the respective values of the power sequence using the positive parameter $\eta 0$ determined by a predetermined method, estimates a time envelope, obtains a whitened sequence which is a sequence obtained by dividing each integer value included in the integer sequence $x\_1, x\_2, \ldots, x\_L$ by each value of the time envelope, obtains a positive parameter $\eta$ with which a generalized Gaussian distribution using the parameter $\eta$ as a shape parameter approximates a histogram of the whitened sequence and outputs the obtained parameter $\eta$ and a parameter code which is a code representing the parameter $\eta$.

On the other hand, when the integer sequence $x\_1, x\_2, \ldots, x\_L$ is obtained by transforming a time-domain digital signal for a predetermined time section into a frequency domain and converting the respectively obtained coefficient values to non-negative integer values, the parameter determiner 30 estimates an spectral envelope by regarding the $\eta_0$-th power of absolute values of the respective integer values included in the integer sequence x_1, x_2, ..., x_L using the positive parameter $\eta_0$ determined by a predetermined method as the respective values of the power spectrum, obtains a whitened spectral sequence which is a sequence obtained by dividing the respective integer values included in the integer sequence x_1, x_2, ..., x_L by the respective values of the spectral envelope, obtains a positive parameter $\eta$ with which a generalized Gaussian distribution using the parameter $\eta$ as a shape parameter approximates a histogram of the whitened spectral sequence and outputs the obtained parameter $\eta$ and a parameter code which is a code representing the parameter $\eta$.

Figure 10:
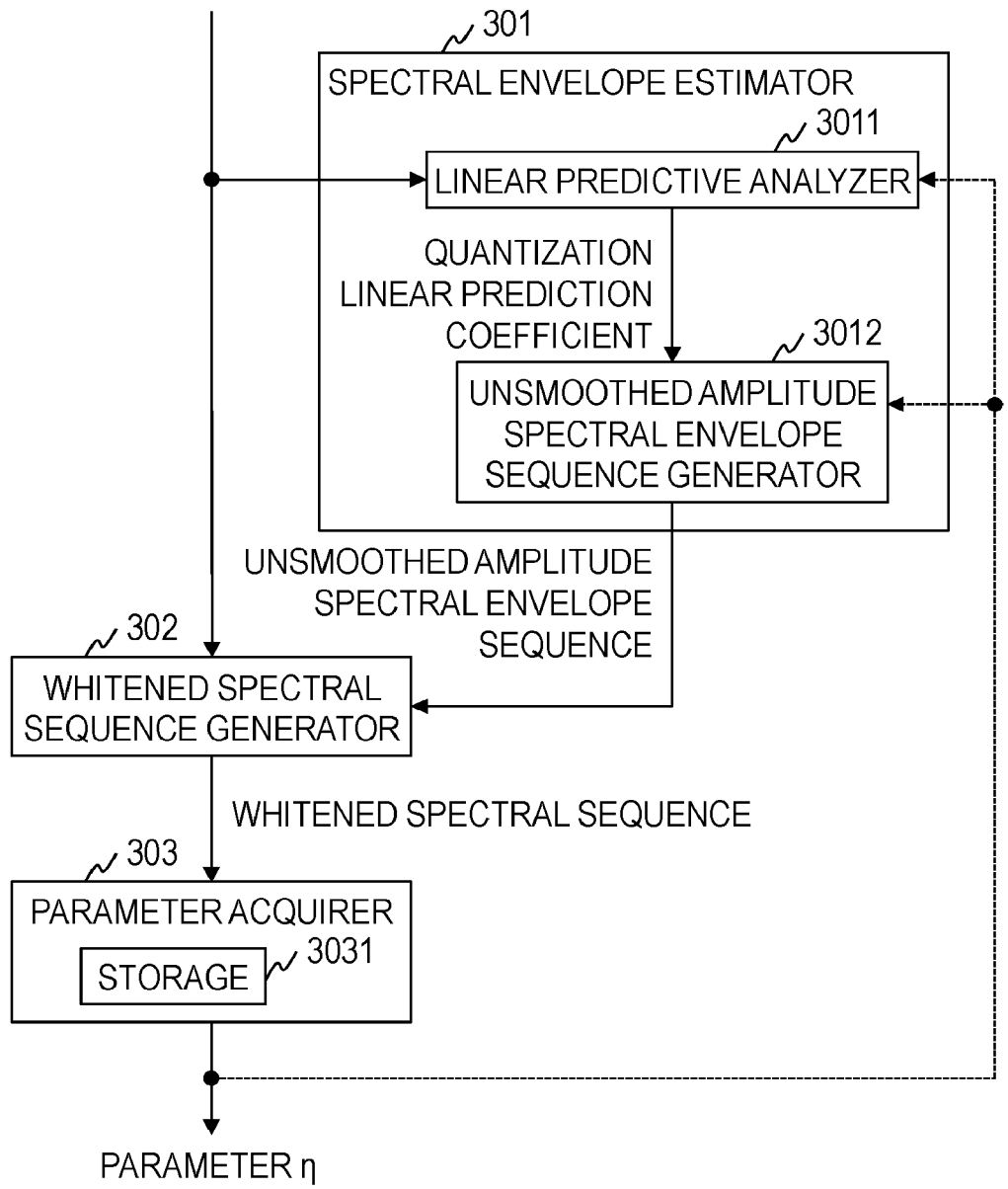
FIG. 10 is a diagram illustrating a functional configuration of a parameter determiner.
Figure 11:
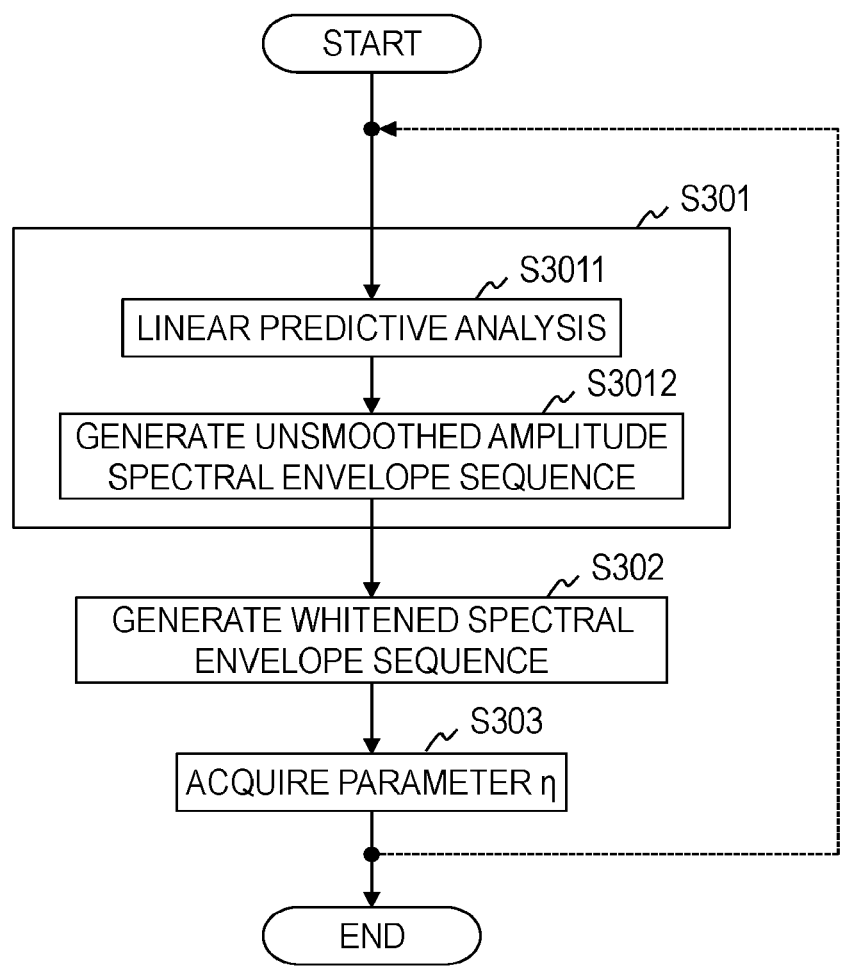
FIG. 11 is a diagram illustrating a processing procedure for a parameter determination method.

Hereinafter, processing of the parameter determiner 30 will be described in detail. FIG. 10 shows a configuration example of the parameter determiner 30. As shown in FIG. 10, the parameter determiner 30 is provided with, for example, a spectral envelope estimator 301, a whitened spectral sequence generator 302 and a parameter acquirer 303. The spectral envelope estimator 301 is provided with, for example, a linear predictive analyzer 3011 and an unsmoothed amplitude spectral envelope sequence generator 3012. FIG. 11 shows an example of each process of a parameter determination method implemented, for example, by this parameter determiner 30.

Hereinafter, the respective components shown in FIG. 10 will be described.

[Spectral Envelope Estimator 301]

The integer sequence x_1, x_2, ..., x_L inputted to the parameter determiner 30 is inputted to the spectral envelope estimator 301. Here, the integer sequence x_1, x_2, ..., x_L is a frequency domain sample sequence obtained by transforming a time-domain sound signal which is a time-series signal into an MDCT coefficient sequence at a point L in the frequency domain, for example, in frame units of a predetermined time length and converting each coefficient of the MDCT coefficient sequence to a non-negative integer value, but the integer sequence is not limited to this. The subsequent processes will be performed in frame units unless specifically defined otherwise.

The spectral envelope estimator 301 performs estimation of a spectral envelope using the $\eta_0$-th power of absolute values of the integer values included in the inputted integer sequence x_1, x_2, ..., x_L as each value of a power spectrum, based on a parameter $\eta_0$ determined by a predetermined method (step C301).

The estimated spectral envelope is outputted to the whitened spectral sequence generator 302.

The spectral envelope estimator 301 performs estimation of a spectral envelope by generating an unsmoothed amplitude spectral envelope sequence through, for example, processes in the linear predictive analyzer 3011 and the unsmoothed amplitude spectral envelope sequence generator 3012 which will be described below.

The parameter $\eta_0$ is assumed to be defined using a predetermined method. For example, $\eta_0$ is assumed to be a predetermined number greater than 0. For example, suppose $\eta_0=1$. Furthermore, $\eta$ obtained in a frame earlier than the frame in which the current parameter $\eta$ is to be calculated may also be used. The "frame earlier than the frame in which the current parameter $\eta$ (hereinafter referred to as a "current frame") is to be calculated" is, for example, a frame preceding the current frame and a frame in the vicinity of the current frame. The frame in the vicinity of the current frame is, for example, a frame immediately preceding the current frame.

[Linear Predictive Analyzer 3011]

The integer sequence x_1, x_2, ..., x_L inputted to the spectral envelope estimator 301 is inputted to the linear predictive analyzer 3011.

The linear predictive analyzer 3011 generates linear prediction coefficients $\beta_1, \beta_2, \ldots, \beta_p$ using the inputted integer sequence x_1, x_2, ..., x_L by performing linear predictive analysis of $\bar{R}(0), \bar{R}(1), \ldots, \bar{R}(L-1)$ defined in formula (19) below.

$$\bar{R}(k) = \sum_{n=1}^{L} |x\_n|^\eta \exp\left(-j\frac{2\pi k n}{L}\right) k = 0, 1, \ldots, L-1 \quad (19)$$

The generated linear prediction coefficients $\beta_1, \beta_2, \ldots, \beta_p$ are outputted to the unsmoothed amplitude spectral envelope sequence generator 3012.

More specifically, by performing operation corresponding to inverse Fourier transform regarding the $\eta_0$-th power of absolute values of the respective integer values included in the integer sequence x_1, x_2, ..., x_L as the respective values of a power spectrum, that is, the operation of formula (19) first, the linear predictive analyzer 3011 determines a pseudo-correlation function signal sequence $\bar{R}(0), \bar{R}(1), \ldots, \bar{R}(L-1)$, which is a time domain signal sequence corresponding to the sequence of the $\eta$-th power of the absolute values of the respective integer values included in the integer sequence x_1, x_2, ..., x_L. The linear predictive analyzer 3011 then generates linear prediction coefficients $\beta_1, \beta_2, \ldots, \beta_p$ by performing linear predictive analysis using the determined pseudo-correlation function signal sequence $\bar{R}(0), \bar{R}(1), \ldots, \bar{R}(L-1)$.

The linear prediction coefficients $\beta_1, \beta_2, \ldots, \beta_p$ are linear prediction coefficients corresponding to a time domain signal when the $\eta_0$-th power of the absolute values of the respective integer values included in the integer sequence x_1, x_2, ..., x_L are regarded as the respective values of a power spectrum.

In this way, the linear predictive analyzer 3011 performs linear predictive analysis using a pseudo-correlation function signal sequence obtained by performing inverse Fourier transform regarding the 7-th power of absolute values of the respective integer values included in the integer sequence x_1, x_2, ..., x_L as the respective values of a power spectrum, and generates linear prediction coefficients (step 3011).

[Unsmoothed Amplitude Spectral Envelope Sequence Generator 3012]

The linear prediction coefficients $\beta_1, \beta_2, \ldots, \beta_p$ generated by the linear predictive analyzer 3011 are inputted to the unsmoothed amplitude spectral envelope sequence generator 3012.

The unsmoothed amplitude spectral envelope sequence generator 3012 generates an unsmoothed amplitude spectral envelope sequence H(0), H(1), ..., H(L−1), which is an amplitude spectral envelope sequence corresponding to the linear prediction coefficients $\beta_1, \beta_2, \ldots, \beta_p$.

The generated unsmoothed amplitude spectral envelope sequence H(0), H(1), ..., H(L−1) is outputted to the whitened spectral sequence generator 302.

The unsmoothed amplitude spectral envelope sequence generator 3012 generates an unsmoothed amplitude spectral envelope sequence H(0), H(1), ..., H(L−1) defined in formula (20) as the unsmoothed amplitude spectral envelope sequence H(0), H(1), ..., H(L−1) using the linear prediction coefficients $\beta_1, \beta_2, \ldots, \beta_p$.

$$H(k) = \left( \frac{1}{2\pi} \frac{1}{\left|1 + \sum_{n=1}^{p} \beta_n \exp(-j2\pi kn/L)\right|^2} \right)^{1/\eta_0} \quad (20)$$

In this way, the unsmoothed amplitude spectral envelope sequence generator 3012 performs estimation of a spectral envelope by obtaining an unsmoothed spectral envelope sequence, which is a sequence obtained by raising an amplitude spectral envelope sequence corresponding to a pseudo-correlation function signal sequence to the $1/\eta_0$-th power, based on linear prediction coefficients generated by the linear predictive analyzer 3011 (step 3012).

[Whitened Spectral Sequence Generator 302]

The integer sequence $x\_1, x\_2, \ldots, x\_L$ inputted to the parameter determiner 30 and the unsmoothed amplitude spectral envelope sequence $H(0), H(1), \ldots, H(L-1)$ generated by the unsmoothed amplitude spectral envelope sequence generator 3012 are inputted to the whitened spectral sequence generator 302.

The whitened spectral sequence generator 302 generates a whitened spectral sequence $X_w(0), X_w(1), \ldots, X_w(L-1)$ by dividing integer values included in the integer sequence $x\_1, x\_2, \ldots, x\_L$ by corresponding values of the unsmoothed amplitude spectral envelope sequence $H(0), H(1), \ldots, H(L-1)$, respectively.

The generated whitened spectral sequence $X_w(0), X_w(1), \ldots, X_w(L-1)$ is outputted to the parameter acquirer 303.

The whitened spectral sequence generator 302 generates each of values $X_w(k)$ of the whitened spectral sequence $X_w(0), X_w(1), \ldots, X_w(L-1)$ by dividing each integer value $x\_k$ of the integer sequence $x\_1, x\_2, \ldots, x\_L$ by each value $H(k)$ of the unsmoothed amplitude spectral envelope sequence $H(0), H(1), \ldots, H(L-1)$ assuming, for example, $k=0, 1, \ldots, L-1$. That is, $X_w(k)=x\_k/H(k)$ assuming that $k=0, 1, \ldots, L-1$.

In this way, the whitened spectral sequence generator 302 obtains a whitened spectral sequence which is a sequence obtained by dividing integer values included in the integer sequence by values of a spectral envelope which is, for example, an unsmoothed amplitude spectral envelope sequence respectively (step S302).

[Parameter Acquirer 303]

The whitened spectral sequence $X_w(0), X_w(1), \ldots, X_w(L-1)$ generated by the whitened spectral sequence generator 302 is inputted to the parameter acquirer 303.

The parameter acquirer 303 determines such a parameter $\eta$ that generalized Gaussian distribution with the parameter $\eta$ as a shape parameter approximates a histogram of the whitened spectral sequence $X_w(0), X_w(1), \ldots, X_w(L-1)$ (step S303). In other words, the parameter acquirer 303 determines such a parameter $\eta$ that generalized Gaussian distribution with the parameter $\eta$ as a shape parameter is close to distribution of the histogram of the whitened spectral sequence $X_w(0), X_w(1), \ldots, X_w(L-1)$.

The generalized Gaussian distribution with the parameter $\eta$ as a shape parameter is defined, for example, as follows. $\Gamma$ is a gamma function.

$$f_{GG}(X \mid \phi, \eta) = \frac{A(\eta)}{\phi} \exp\left(-\left|B(\eta)\frac{X}{\phi}\right|^\eta\right),$$

$$A(\eta) = \frac{\eta B(\eta)}{2\Gamma(1/\eta)}, \quad B(\eta) = \sqrt{\frac{\Gamma(3/\eta)}{\Gamma(1/\eta)}}, \quad \Gamma(x) = \int_0^\infty e^{-t} t^{x-1} dt$$

Figure 12:
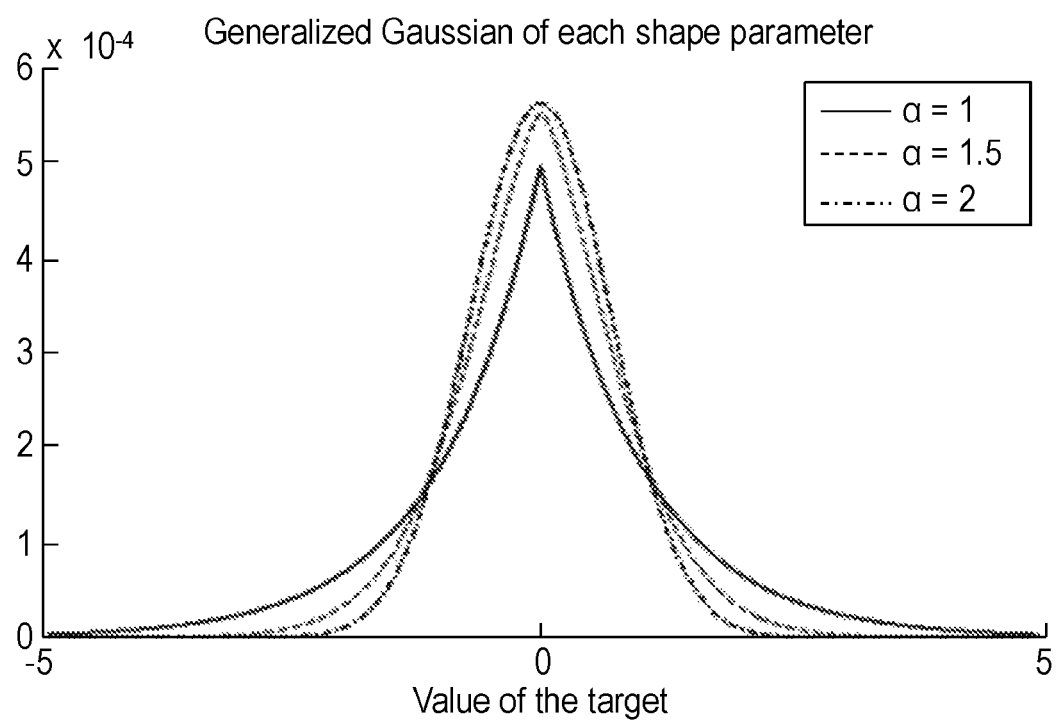
FIG. 12 is a diagram for describing a generalized Gaussian distribution.

The generalized Gaussian distribution is such that makes it possible to express various distributions by changing $\eta$ which is a shape parameter. For example, Laplacian distribution and Gaussian distribution are expressed at the time of $\eta=1$ and at the time of $\eta=2$, respectively, as shown in FIG. 12. Here, $\varphi$ is a parameter corresponding to variance.

Here, $\eta$ determined by the parameter acquirer 303 is defined, for example, by formula (21) below. Here, $F^{-1}$ is an inverse function of a function F. This formula is derived from a so-called moment method.

$$\eta = F^{-1}\left(\frac{m_1}{\sqrt{m_2}}\right) \quad (21)$$

$$F(\eta) = \frac{\Gamma(2/\eta)}{\sqrt{\Gamma(1/\eta)\Gamma(3/\eta)}}$$

$$m_1 = \frac{1}{L}\sum_{k=0}^{L-1}|X_W(k)|, \quad m_2 = \frac{1}{L}\sum_{k=0}^{L-1}|X_W(k)|^2$$

To calculate the value of $\eta$ defined in formula (21), the parameter acquirer 303 may determine parameter $\eta$ using, for example, a first method or a second method which will be described below.

The first method for determining the parameter $\eta$ will be described. In the first method, the parameter acquirer 303 calculates $m_1/((m_2)^{1/2})$ based on a whitened spectral sequence and, by referring to a plurality of different pairs of $\eta$ and $F(\eta)$ corresponding to $\eta$ and parameter codes corresponding to $\eta$ prepared in advance, obtains and outputs $\eta$ corresponding to $F(\eta)$ and the parameter code corresponding to $\eta$ which is the closest to the calculated $m_1/((m_2)^{1/2})$.

The plurality of different pairs of $\eta$ and $F(\eta)$ corresponding to $\eta$ and parameter codes corresponding to $\eta$ prepared in advance are stored in a storage 3031 of the parameter acquirer 303 in advance. The parameter acquirer 303 finds $F(\eta)$ closest to the calculated $m_1/((m_2)^{1/2})$ by referring to the storage 3031, and reads $\eta$ corresponding to the found $F(\eta)$ and the parameter code corresponding to $\eta$ from the storage 3031 and outputs it.

Here, $F(q)$ closest to the calculated $m_1/((m_2)^{1/2})$ refers to such $F(\eta)$ that an absolute value of a difference from the calculated $m_1/((m_2)^{1/2})$ is the smallest.

The second method for determining the parameter $\eta$ will be described. In the second method, on the assumption that an approximate curve function of the inverse function $F^{-1}$ is, for example, $\tilde{F}^{-1}$ indicated by an formula (21') below, the parameter acquirer 303 calculates $m_1/((m_2)^{1/2})$ based on a whitened spectral sequence and determines $\eta$ by calculating an output value when the calculated $m_1/((m_2)^{1/2})$ is inputted to the approximate curve function $\tilde{F}^{-1}$ and outputs the calculated parameter $\eta$ and the parameter code which is a code representing the parameter $\eta$. It is only necessary that this approximate curve function $\tilde{F}^{-1}$ is such a monotonically increasing function that an output is a positive value in a used domain.

$$\eta = \tilde{F}^{-1}\left(\frac{m_1}{\sqrt{m_2}}\right) \quad (21')$$

$$\tilde{F}^{-1}(x) = \frac{0.2718}{0.7697 - x} - 0.1247$$

Note that η determined by the parameter acquirer 303 may be defined not by formula (21) but by an formula obtained by generalizing formula (21) using positive integers $q_1$ and $q_2$ specified in advance ($q_1 < q_2$) like formula (21").

$$\eta = F'^{-1}\left(\frac{m_{q_1}}{(m_{q_2})^{q_1/q_2}}\right) \quad (21'')$$

$$F'(\eta) = \frac{\Gamma((q_1+1)/\eta)}{*\Gamma(1/\eta))^{1-q_1/q_2}(\Gamma((q_2+1)/\eta))^{q_1/q_2}}$$

$$m_{q_1} = \frac{1}{L}\sum_{k=0}^{L-1}|X_W(k)|^{q_1}, \quad m_{q_2} = \frac{1}{L}\sum_{k=0}^{L-1}|X_W(k)|^{q_2}$$

In the case where η is defined by the formula (21") also, η can be determined in a method similar to the method in the case where η is defined by the formula (21). That is, after calculating a value $m_{q_1}/((m_{q_2})^{q_1/q_2})$ based on $m_{q_1}$ which is the $q_1$-th order moment of a whitened spectral sequence, and $m_{q_2}$ which is the $q_2$-th order moment of the whitened spectral sequence, based on the whitened spectral sequence, for example, the parameter acquirer 303 can, by referring to a plurality of different pairs of η and F'(η) corresponding to η prepared in advance, acquire η corresponding to F'(η) closest to the calculated $m_{q_1}/((m_{q_2})^{q_1/q_2})$ or can determine η by calculating, on the assumption that an approximate curve function of the inverse function $F'^{-1}$ is $\tilde{F}'^{-1}$, an output value when the calculated $m_{q_1}/((m_{q_2})^{q_1/q_2})$ is inputted to the approximate curve function $\tilde{F}'^{-1}$, similarly to the first and second methods described above.

As described above, η can be said to be a value based on two different moments $m_{q_1}$ and $m_{q_2}$ in different orders. For example, η may be determined based on a value of a ratio between a value of a moment in a lower order or a value based on the value of the moment (hereinafter referred to as the former) and a value of a moment in a higher order or a value based on the value of the moment (hereinafter referred to as the latter), or a value based on the value of the ratio, or a value obtained by dividing the former by the latter of the two different moments $m_{q_1}$ and $m_{q_2}$ in different orders. The value based on a moment refers to, for example, $m^Q$ when the moment is indicated by m, and a predetermined real number is indicated by Q. Further, η may be determined by inputting these values to the approximate curve function $\tilde{F}'^{-1}$. It is only necessary that this approximate curve function $\tilde{F}'^{-1}$ is such a monotonically increasing function that an output is a positive value in a used domain similarly as described above.

The above description referring to FIG. 10 and FIG. 11 assumes that the integer sequence x_1, x_2, . . . , x_L inputted to the parameter determiner 30 is a frequency domain sample sequence, which is, for example, an MDCT coefficient sequence, but a signal inputted to the encoder is not limited to a frequency domain sample sequence of non-negative integer numerical values, and the parameter determiner 30 in FIG. 10 and FIG. 11 can also be used even when those signals are other signals. That is, the encoder including the parameter determiner 30 in FIG. 10 and FIG. 11 can function correctly irrespective of whether a signal inputted to the encoder is in a time domain or in a frequency domain, or whether the signal is not converted to an integer or a non-negative integer.

Figure 13:
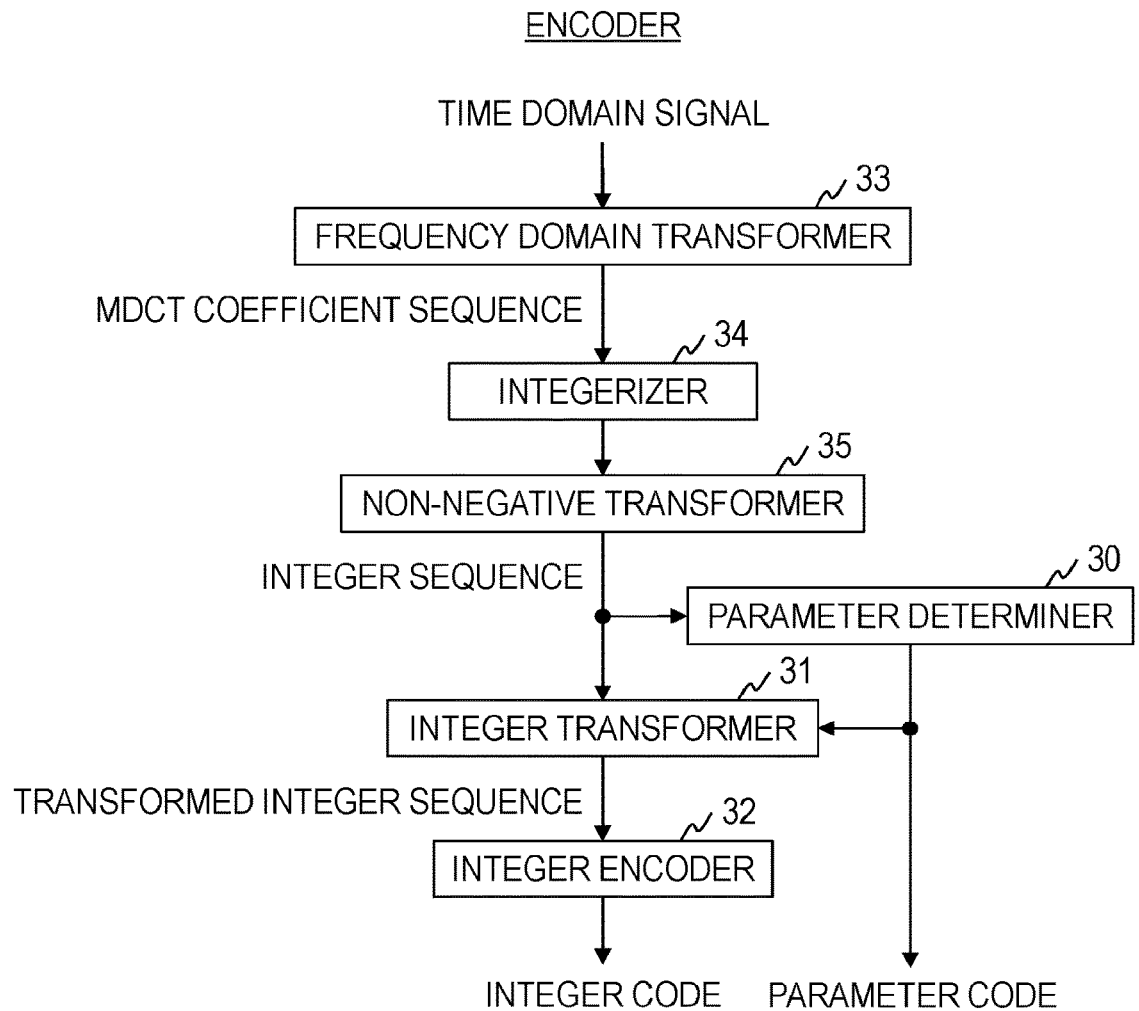
FIG. 13 is a diagram illustrating a functional configuration of the encoder of the fifth embodiment.

For example, when a time domain digital signal including a decimal value or negative value is inputted to the encoder, as shown in FIG. 13, the encoder is further provided with a frequency domain transformer 33, an integerizer 34 and a non-negative transformer 35 so that the frequency domain transformer 33 may transform an inputted time domain digital signal into, for example, an MDCT coefficient sequence for each frame of a predetermined time section, the integerizer 34 and the non-negative transformer 35 may convert the MDCT coefficient sequence into a sequence of integers or non-negative integers, and input the sequence to the parameter determiner 30 and the integer transformer 31 as an integer sequence x_1, x_2, . . . , x_L. The integerizer 34 performs integerization by rounding off the decimal part of each value of the inputted MDCT coefficient sequence or dividing it by some quantization value and then rounding off the decimal part. The non-negative transformer 35 performs non-negative transformation through one-to-one bijective transformation of integer values including negative values included in the MDCT coefficient sequence after integerization to a non-negative integer value or transformation that handles codes representing positive and negative values separately or the like. The order of integerization and non-negative transformation may be reversed, that is, the MDCT coefficient sequence may be integerized after non-negative transformation or integerization and non-negative transformation may be performed simultaneously.

Figure 14:
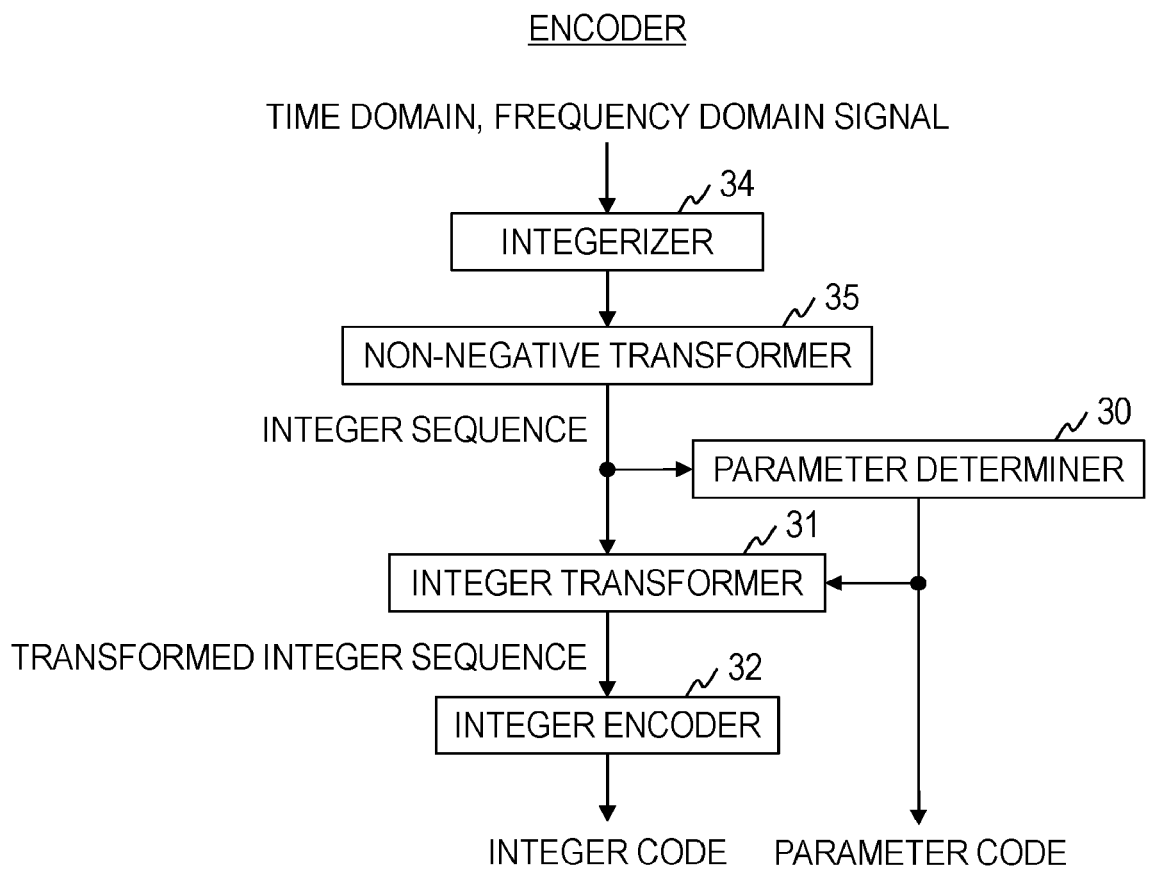
FIG. 14 is a diagram illustrating a functional configuration of the encoder of the fifth embodiment.

Note that even if a digital signal of the time domain including a decimal value or negative value is inputted to the encoder, such a signal may be inputted to the parameter determiner 30 in the time domain as is without transformation into a frequency domain signal. That is, even if the digital signal including the inputted decimal value or negative value is in the time domain or in the frequency domain, as shown in FIG. 14, the encoder may not be provided with the frequency domain transformer 33 in the configuration shown in FIG. 13 and may input a sample sequence obtained by performing only integerization and non-negative transformation on a digital signal in each frame of a predetermined time section to the parameter determiner 30 and the integer transformer 31 as an integer sequence x_1, x_2, . . . , x_L.

Figure 15:
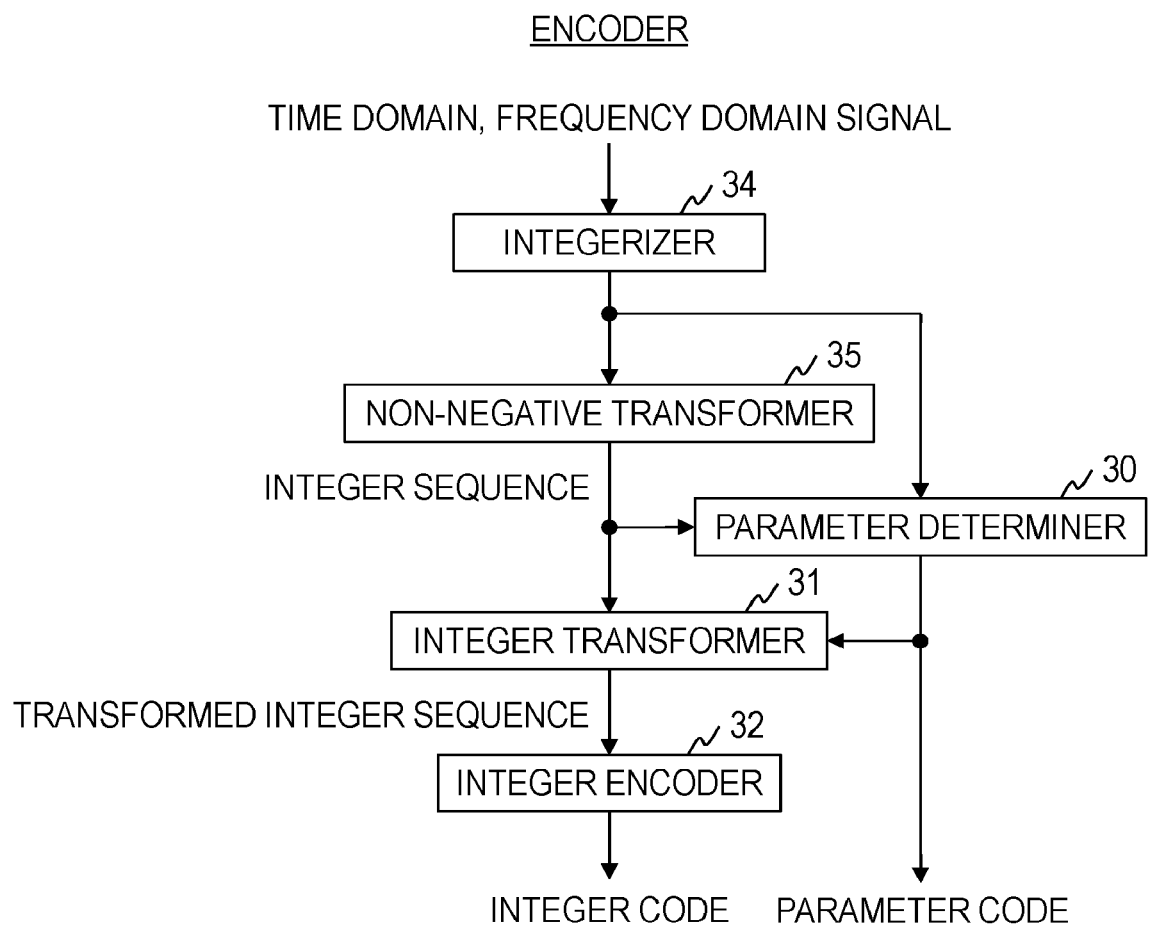
FIG. 15 is a diagram illustrating a functional configuration of the encoder of the fifth embodiment.
Figure 16:
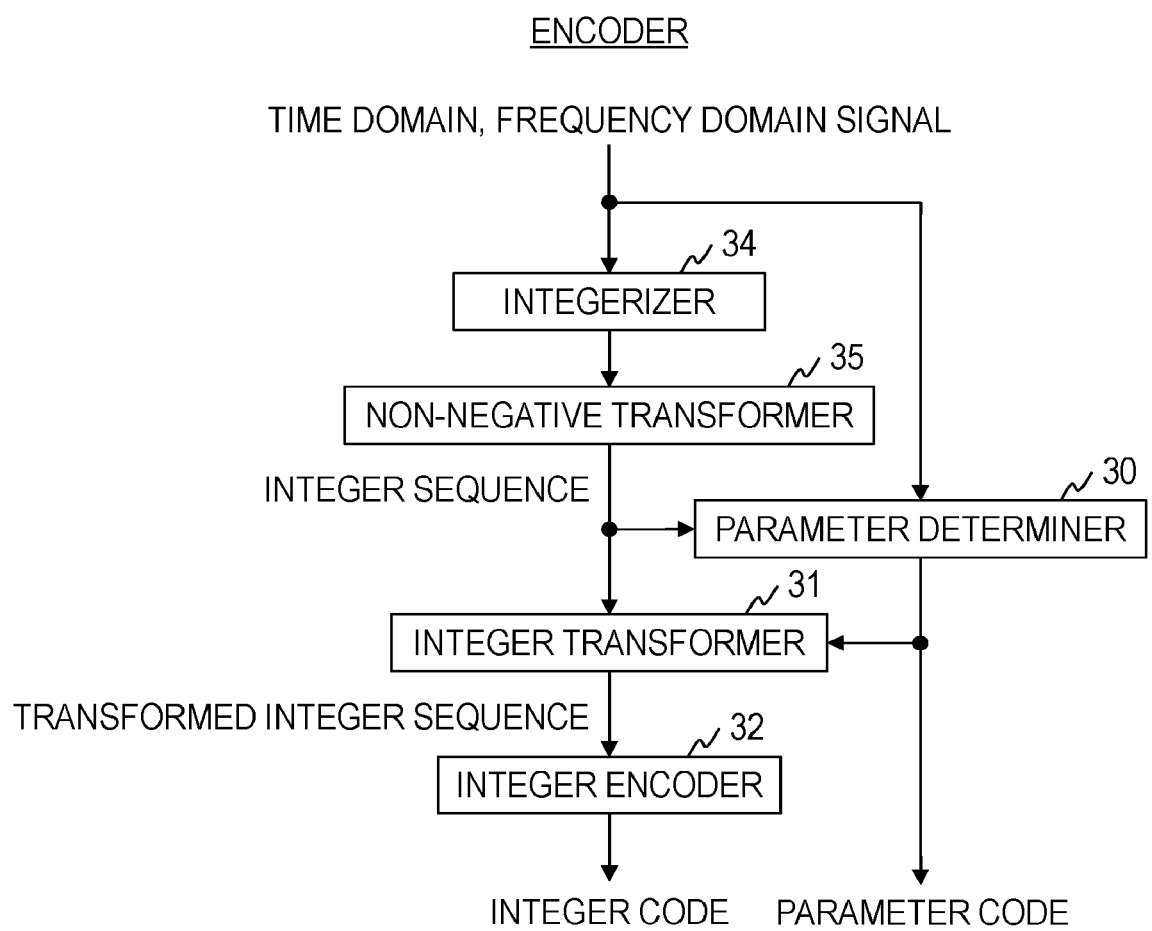
FIG. 16 is a diagram illustrating a functional configuration of the encoder of the fifth embodiment.

When the non-negative transformation performed by the non-negative transformer 35 is not processing which considerably changes the magnitude of value (e.g., when codes representing positive and negative values are handled separately), as shown in FIG. 15, although a sample sequence outputted by the non-negative transformer 35 is inputted to the integer transformer 31 as an integer sequence x_1, x_2, . . . , x_L, whereas a sample sequence before the non-negative transformation may be inputted to the parameter determiner 30 as the integer sequence x_1, x_2, . . . , x_L.

When the integerization processing performed by the integerizer 34 divides all the sample values of the digital signal in each frame of the predetermined time section by the same quantization value and rounds off the decimal part, it is often the case that theoretically the same i is obtained irrespective of whether integerization is performed or not. Therefore, when integerization is performed by rounding off the decimal part of each sample value of the digital signal in each frame of the predetermined time section or when all the sample values of the digital signal in each frame of the predetermined time section are divided by the same quantization value and then the decimal part is rounded off, the sample sequence outputted by the non-negative transformer 35 is inputted as an integer sequence $x\_1, x\_2, \ldots, x\_L$, whereas a sample sequence before being inputted to the integerizer 34 may be inputted to the parameter determiner 30 instead of the integer sequence $x\_1, x\_2, \ldots, x\_L$. However, it should be noted that when the quantization value is too large, non-negligible errors may appear from the parameter η obtained from the integer sequence after integerization among the parameter η obtained from the integer sequence after integerization and the parameter η obtained using the sample sequence before integerization.

[Integer Transformer 31]

The integer sequence $x\_1, x\_2, \ldots, x\_L$, which is a sequence of integer values of L samples each of the sequence of integer values inputted to the encoder, and the index value outputted by the parameter determiner 30 are inputted to the integer transformer 31. Here, the integer sequence $x\_1, x\_2, \ldots, x\_L$ inputted to the integer transformer 31 is the same integer sequence used to obtain the index value inputted from the parameter determiner 30. The integer transformer 31 outputs, as a transformed integer sequence, a sequence of integer values obtained through operation including at least any one of obtaining one integer value through algebraically-representable bijective transformation for each of the integer sets of a plurality of integer values in the inputted integer sequence $x\_1, x\_2, \ldots, x\_L$ based on the inputted index value and obtaining a plurality of integer values through algebraically-representable bijective transformation for each of integer values in the inputted integer sequence $x\_1, x\_2, \ldots, x\_L$ (step S31).

Hereinafter, an example of operation performed by the integer transformer 31 will be described. Note that the operation of the integer transformer 31 is not limited to the following example, but it is also possible to switch among a plurality of operations of the integer transformers of the encoders of the first to fourth embodiments based on an inputted index value, switch the value of M of the integer transformer of the encoder of the third embodiment or the fourth embodiment based on an inputted index value or switch between at least any one of these operations and the operation of outputting the inputted integer sequence as a transformed integer sequence as is based on the inputted index value. In the following example, although a case will be described where the inputted index value is a parameter η, the index value is not limited to the parameter η but the index value may be any one which is an index value representing a property of distribution of an integer sequence and which corresponds to a parameter code.

Example 1-1: Example of Switching Between Operation of Integer Transformer 11 of Encoder of First Embodiment and Operation of Integer Transformer 13 of Encoder of Second Embodiment Based on Parameter η

When the inputted parameter η exceeds a predetermined threshold, for example, when T1>1, the integer transformer 31 obtains a natural number N which is 2N=L, assumes the inputted integer sequence $x\_1, x\_2, \ldots, x\_L$ to be an integer sequence $x\_1, x\_2, \ldots, x\_{2N}$, obtains N integer sets of two integer values according to a predetermined rule similar to that of the integer transformer 11 of the encoder of the first embodiment from the integer sequence $x\_1, x\_2, \ldots, x\_{2N}$, obtains one integer value through algebraically-representable bijective transformation similar to the integer transformer 11 of the encoder of the first embodiment for each of the obtained N integer sets and outputs a obtained sequence of N integer values $y\_1, y\_2, \ldots, y\_N$ to the integer encoder 32 as a transformed integer sequence.

When the inputted parameter η is other than that described above, the integer transformer 31 assumes N=L, assumes the inputted integer sequence $x\_1, x\_2, \ldots, x\_L$ to be an integer sequence $x\_1, x\_2, \ldots, x\_N$, obtains two integer values through algebraically-representable bijective transformation similar to the integer transformer 13 of the encoder of the second embodiment for each of N integer values in the integer sequence $x\_1, x\_2, \ldots, x\_N$ and outputs the obtained sequence of 2N integer values $y\_1, y\_2, \ldots, y\_{2N}$ to the integer encoder 32 as the transformed integer sequence.

Note that in the case of example 1-1, L is assumed to be an even number.

Example 1-2: Example where Value of M of Integer Transformer 15 of Encoder of Third Embodiment is Switched Based on Parameter η

The integer transformer 31 first obtains a natural number M which is closest to the inputted parameter q and by which L is divisible, and a natural number N which is the quotient of L divided by M. The integer transformer 31 then assumes the inputted integer sequence $x\_1, x\_2, \ldots, x\_L$ as the integer sequence $x\_1, x\_2, \ldots, x\_{MN}$, obtains N integer sets of M integer values according to a predetermined rule similar to the integer transformer 15 of the encoder of the third embodiment from the integer sequence $x\_1, x\_2, \ldots, x\_{MN}$, obtains one integer value through algebraically-representable bijective transformation similar to the integer transformer 15 of the encoder of the third embodiment for each of the N integer sets and outputs the obtained sequence of N integer values $y\_1, y\_2, \ldots y\_N$ to the integer encoder 32 as the transformed integer sequence.

Note that combinations of the natural number M and the natural number N which correspond to M×N=L are stored in the integer transformer 31 in advance, the natural number M closest to the inputted parameter η and the natural number N combined with the natural number M may be obtained from among the stored combinations.

Example 1-3: Example where Value of M of Integer Transformer 17 of Encoder of Fourth Embodiment is Switched Based on Parameter η

The integer transformer 31 first obtains a natural number M closest to a reciprocal of the inputted parameter η. The integer transformer 31 then obtains M integer values through algebraically-representable bijective transformation similar to the integer transformer 17 of the encoder of the fourth embodiment for each of the L integer values in the inputted integer sequence $x\_1, x\_2, \ldots, x\_L$ and outputs the obtained sequence of ML (M×L) integer values $y\_1, y\_2, \ldots, y\_{ML}$ to the integer encoder 32 as the transformed integer sequence.

Example 1-4: Example where Operation of Integer Transformer 15 of Encoder of Third Embodiment and Operation of Integer Transformer 17 of Encoder of Fourth Embodiment are Switched Based on Parameter i and Value of M of Integer Transformer 15 of Encoder of Third Embodiment and Value of M of Integer Transformer 17 of Encoder of Fourth Embodiment are Switched Based on Parameter η

When the inputted parameter η is 1 or greater, the integer transformer 31 first obtains a natural number M which is closest to the inputted parameter η and by which L is divisible and a natural number N which is the quotient of L divided by M as in the case of example 1-2. The integer transformer 31 then assumes the inputted integer sequence x_1, x_2, . . . , x_L to be an integer sequence x_1, x_2, . . . , x_MN, obtains N integer sets of M integer values according to a predetermined rule similar to the integer transformer 15 of the encoder of the third embodiment from the integer sequence x_1, x_2, . . . , x_MN, obtains one integer value through algebraically-representable bijective transformation similar to the integer transformer 15 of the encoder of the third embodiment for each of the N integer sets and outputs the obtained sequence of N integer values y_1, y_2, . . . y_N to the integer encoder 32 as a transformed integer sequence.

When the inputted parameter η is other than that described above, the integer transformer 31 first obtains the natural number M closest to the reciprocal of the inputted parameter η as in the case of example 1-3. The integer transformer 31 then obtains M integer values through algebraically-representable bijective transformation similar to the integer transformer 17 of the encoder of the fourth embodiment for each of the L integer values in the inputted integer sequence x_1, x_2, . . . , x_L and outputs a obtained sequence of ML integer values y_1, y_2, . . . , y_ML to the integer encoder 32 as a transformed integer sequence.

Example 1-5: Example where Operation of Integer Transformer 11 of Encoder of First Embodiment and Operation of Outputting Inputted Integer Sequence as Transformed Integer Sequence as is are Switched Based on Parameter η

When the inputted parameter η exceeds a predetermined threshold, for example, when η>1.5, the integer transformer 31 obtains a natural number N which is 2N=L, assumes the inputted integer sequence x_1, x_2, . . . , x_L to be an integer sequence x_1, x_2, . . . , x_2N, obtains N integer sets of two integer values according to a predetermined rule similar to the integer transformer 11 of the encoder of the first embodiment from the integer sequence x_1, x_2, . . . , x_2N, obtains one integer value through algebraically-representable bijective transformation similar to the integer transformer 11 of the encoder of the first embodiment for each of the obtained N integer sets and outputs the obtained sequence of the N integer values y_1, y_2, . . . , y_N to the integer encoder 32 as a transformed integer sequence.

When the inputted parameter η is other than that described above, the integer transformer 31 assumes the inputted integer sequence x_1, x_2, . . . , x_L to be the transformed integer sequence y_1, y_2, . . . , y_L as is and outputs the integer sequence to the integer encoder 32.

[Integer Encoder 32]

The transformed integer sequence outputted by the integer transformer 31 is inputted to the integer encoder 32. As in the case of the integer encoder of the encoder according to the first embodiment to the fourth embodiment, the integer encoder 32 Golomb-Rice encodes respective integer values included in the inputted transformed integer sequence, that is, obtains respective Golomb-Rice codes with a predetermined Rice parameter r corresponding to the respective integer values and outputs a code group of the obtained codes as an integer code (step S32).

<<Decoder>>

Figure 17:
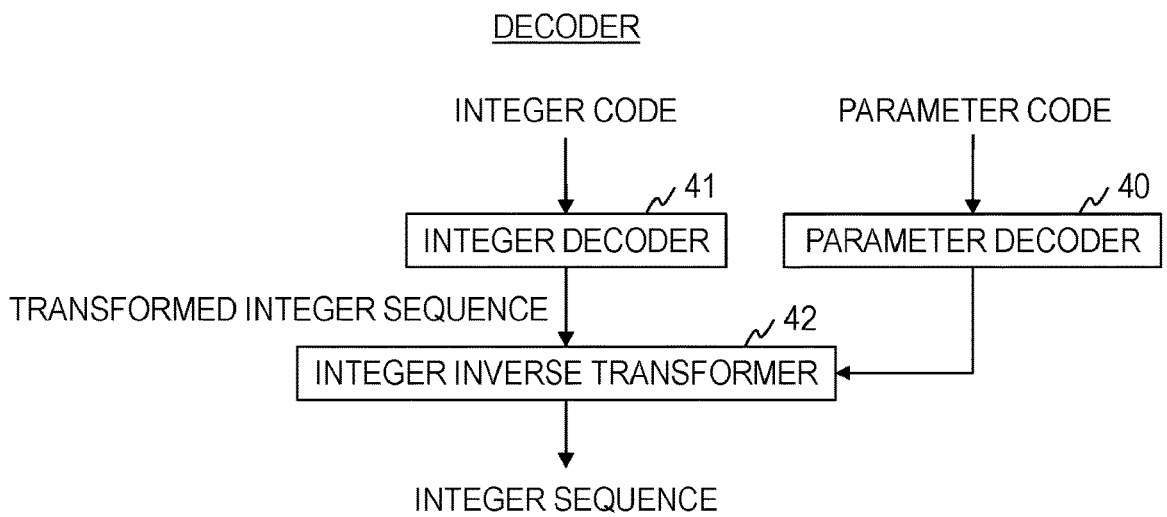
FIG. 17 is a diagram illustrating a functional configuration of the encoder of the fifth embodiment.
Figure 18:
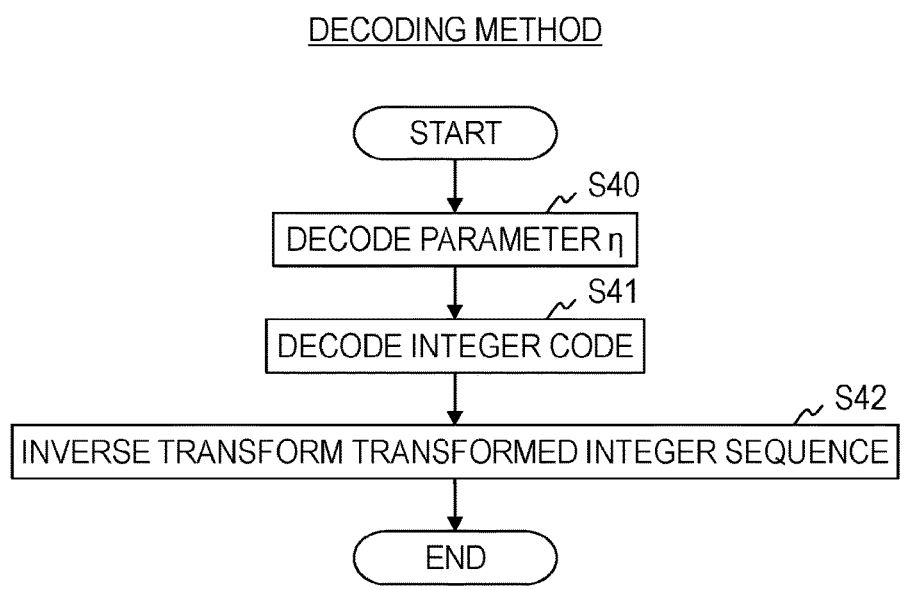
FIG. 18 is a diagram illustrating a processing procedure for a decoding method of the fifth embodiment.

A processing procedure for a decoding method executed by a decoder of the fifth embodiment will be described with reference to FIG. 17 and FIG. 18. As shown in FIG. 17, the decoder of the fifth embodiment is constructed of a parameter decoder 40, an integer decoder 41 and an integer inverse transformer 42. The decoding method of the fifth embodiment is implemented by the decoder executing processes in respective steps shown in FIG. 18.

A parameter code and an integer code outputted by the encoder of the fifth embodiment are inputted to the decoder of the fifth embodiment.

[Parameter Decoder 40]

The parameter code inputted to the decoder is inputted to the parameter decoder 40. The parameter decoder 40 decodes the parameter code through a decoding process corresponding to the process through which the parameter determiner 30 obtains the parameter code, thereby obtains an index value and outputs it. For example, when the parameter determiner 30 of the encoder obtains a parameter code from a parameter η, the parameter decoder 40 decodes the parameter code, obtains the parameter i and outputs it (step S40).

[Integer Decoder 41]

The integer code inputted to the decoder is inputted to the integer decoder 41. As in the case of the integer decoder of the decoder of the first embodiment to the fourth embodiment, the integer decoder 41 Golomb-Rice decodes the respective inputted integer codes, that is, obtains respective integer values from the respective integer codes which are Golomb-Rice codes with a predetermined Rice parameter r and outputs the obtained sequence of integer values to the integer inverse transformer 42 as a transformed integer sequence (step S41).

[Integer Inverse Transformer 42]

The transformed integer sequence outputted by the integer decoder 41 and an index value outputted by the parameter decoder 40 are inputted to the integer inverse transformer 42. Through an operation corresponding to the operation performed by the integer transformer 31 of the encoder of the fifth embodiment based on the inputted index value, the integer inverse transformer 42 outputs, as an integer sequence, a sequence of integer values obtained through operation including at least any one of obtaining a plurality of integer values through algebraically-representable bijective transformation for each of the integer values in the inputted transformed integer sequence and obtaining one integer value through algebraically-representable bijective transformation for each set of a plurality of integer values in the inputted transformed integer sequence (step S42).

Hereinafter, an example of operation performed by the integer inverse transformer 42 will be described. Note that the operation of the integer inverse transformer 42 is not limited to the following example, but if it is an operation corresponding to the operation of the integer transformer 31 of the encoder of the fifth embodiment, it is possible to switch among a plurality of operations of the integer inverse transformer of the decoder of the first embodiment to the fourth embodiment based on an inputted index value or switch the value of M of the integer inverse transformer of the decoder of the third embodiment or the fourth embodiment based on the inputted index value or switch between at least any one of these operations and the operation of outputting the inputted transformed integer sequence as is as an integer sequence based on the inputted index value.

Example 2-1: Example where Operation of Integer Inverse Transformer 22 of Decoder of First Embodiment and Operation of Integer Inverse Transformer 24 of Decoder of Second Embodiment are Switched Based on Parameter η

When the inputted parameter η exceeds a predetermined threshold, for example when η>1, the integer inverse transformer 42 assumes the inputted transformed integer sequence to be a sequence y_1, y_2, . . . , y_N of N transformed integers, performs transformation inverse to that performed by the integer transformer 11 of the encoder of the first embodiment for each of the N integer values in the inputted transformed integer sequence y_1, y_2, . . . , y_N, thereby obtains N sets of two integer values, obtains and outputs an integer sequence x_1, x_2, . . . , x_2N which is a sequence of 2N integer values according to a rule corresponding to the rule carried out by the integer transformer 11 of the encoder of the first embodiment from the obtained N integer sets.

When the inputted parameter η is other than that described above, the integer inverse transformer 42 assumes the inputted transformed integer sequence to be a sequence of 2N transformed integers, y_1, y_2, . . . , y_2N, obtains N integer sets of two integer values from the inputted transformed integer sequence y_1, y_2, . . . , y_2N, performs transformation inverse to that performed by the integer transformer 13 of the encoder of the second embodiment for each of the obtained N integer sets, thereby obtains one integer value and outputs an integer sequence x_1, x_2, . . . , x_N which is the obtained sequence of N integer values.

Example 2-2: Example where Value of M of Integer Inverse Transformer 26 of Decoder of Third Embodiment is Switched Based on Parameter η

The integer inverse transformer 42 first obtains a natural number M which is closest to the inputted parameter η and by which L is divisible, and a natural number N which is the quotient of L divided by M. The integer inverse transformer 42 then assumes the inputted transformed integer sequence to be a sequence of N transformed integers y_1, y_2, . . . , y_N, performs transformation inverse to that performed by the integer transformer 15 of the encoder of the third embodiment for each of the N integer values in the inputted transformed integer sequence y_1, y_2, . . . , y_N, obtains N integer sets of M integer values, obtains and outputs an integer sequence of MN integer values x_1, x_2, . . . , x_MN according to a rule corresponding to the rule carried out by the integer transformer 15 of the encoder of the third embodiment from the obtained N integer sets.

Note that combinations of the natural number M and the natural number N which correspond to M×N=L may be stored in the integer inverse transformer 42 in advance so as to obtain, from among the stored combinations, a natural number M closest to the inputted parameter η and a natural number N combined with the natural number M.

Example 2-3: Example where Value of M of Integer Inverse Transformer 28 of Decoder of Fourth Embodiment is Switched Based on Parameter η

The integer inverse transformer 42 first obtains a natural number M closest to a reciprocal of the inputted parameter η. The integer inverse transformer 42 then assumes the inputted transformed integer sequence to be a sequence of ML transformed integers y_1, y_2, . . . , y_ML, obtains L integer sets of M integer values according to a rule corresponding to the rule carried out by the integer transformer 17 of the encoder of the fourth embodiment from the inputted transformed integer sequence y_1, y_2, . . . , y_ML, performs transformation inverse to that performed by the integer transformer 17 of the encoder of the fourth embodiment, thereby obtains one integer value and outputs an integer sequence x_1, x_2, . . . , x_L which is the obtained sequence of L integer values.

Example 2-4: Example where Operation of Integer Inverse Transformer 26 of Decoder of Third Embodiment and Operation of Integer Inverse Transformer 28 of Decoder of Fourth Embodiment are Switched Based on Parameter η, and Value of M of Integer Inverse Transformer 26 of Decoder of Third Embodiment and Value of M of Integer Inverse Transformer 28 of Decoder of Fourth Embodiment are Switched Based on Parameter η

When the inputted parameter η is 1 or greater, the integer inverse transformer 42 first obtains a natural number M which is closest to the inputted parameter η and by which L is divisible and a natural number N which is the quotient of L divided by M as in the case of example 2-2. The integer inverse transformer 42 then assumes the inputted transformed integer sequence to be a sequence of N transformed integers y_1, y_2, . . . , y_N, performs transformation inverse to that performed by the integer transformer 15 of the encoder of the third embodiment for each of N integer values in the inputted transformed integer sequence y_1, y_2, . . . , y_N and obtains and outputs an integer sequence of MN integer values x_1, x_2, . . . , x_MN according to a rule corresponding to the rule carried out by the integer transformer 15 of the encoder of the third embodiment from the obtained N integer sets.

When the inputted parameter η is other than that described above, the integer inverse transformer 42 first obtains a natural number M closest to a reciprocal of the inputted parameter η as in the case of example 2-3. The integer inverse transformer 42 then assumes the inputted transformed integer sequence to be a sequence of ML transformed integers y_1, y_2, . . . , y_ML, obtains L integer sets of M integer values according to a rule corresponding to the rule carried out by the integer transformer 17 of the encoder of the fourth embodiment from the inputted transformed integer sequence y_1, y_2, . . . , y_ML, performs transformation inverse to that performed by the integer transformer 17 of the encoder of the fourth embodiment for each of the obtained L sets of integers, thereby obtains one integer value and outputs an integer sequence x_1, x_2, . . . , x_L which is the obtained sequence of L integer values.

Example 2-5: Example where Operation of Integer Inverse Transformer 22 of First Embodiment and Operation of Outputting Inputted Transformed Integer Sequence as is as Integer Sequence are Switched Based on Parameter η

When the inputted parameter η exceeds a predetermined threshold, for example, when η>1.5, the integer inverse transformer 42 assumes the inputted transformed integer sequence to be a sequence of N transformed integers y_1, y_2, . . . , y_N, performs transformation inverse to that performed by the integer transformer 11 of the encoder of the first embodiment for each of the N integer values in the inputted transformed integer sequence y_1, y_2, . . . , y_N, thereby obtains N integer sets of two integer values, obtains and outputs an integer sequence x_1, x_2, . . . , x_2N which is a sequence of 2N integer values according to a rule corresponding to the rule carried out by the integer transformer 11 of the encoder of the first embodiment from the obtained N integer sets.

When the inputted parameter η is other than that described above, the integer inverse transformer 42 outputs the inputted transformed integer sequence as is as an integer sequence.

<<Operations and Effects>>

According to the fifth embodiment, it is possible to implement an encoding process that results in a shorter bit length than that in Golomb-Rice encoding and a decoding process corresponding to the encoding process even for sequences differing in degree of density or sparsity of distribution from one partial sequence to another in the sequence of integer values inputted to the encoder, that is, sequences, a distribution of integer values of which is denser or sparser than a Laplacian distribution for each partial sequence or sequences, a distribution of integer values of which has a higher or lower degree of density or sparsity than a Laplacian distribution for each partial sequence.

Sixth Embodiment

A mode has been described in the first embodiment or the third embodiment in which the integer encoder of the encoder Golomb-Rice encodes a transformed integer sequence and outputs a Golomb-Rice code obtained through encoding as an integer code, but the above-described mode may be changed to a configuration in which the transformed integer sequence is encoded through encoding under an encoding scheme, which is not Golomb-Rice encoding and the code obtained by the encoding is outputted as an integer code. In this case, the integer decoder of the corresponding decoder decodes the integer code under a decoding scheme corresponding to the encoding scheme performed by the integer encoder of the encoder and obtains the transformed integer sequence.

<<Encoder>>

The encoder of the sixth embodiment corresponds to the encoder of the first embodiment or the third embodiment with the integer encoder 12 or 16 changed so as to encode the transformed integer sequence under an encoding scheme other than Golomb-Rice encoding. As in the case of the encoder of the first embodiment or the third embodiment, the encoder of the sixth embodiment is provided with, for example, the integer transformer 11 or 15 and the integer encoder 20 as shown in FIG. 2 and an encoding method of the sixth embodiment is implemented by executing processes in respective steps shown in FIG. 3.

Since the integer encoder of the encoder of the sixth embodiment is the only part changed from the encoder of the first embodiment or third embodiment, only the integer encoder 20 will be described below.

[Integer Encoder 20]

The transformed integer sequence $y\_1, y\_2, \ldots, y\_N$ outputted by the integer transformer 11 or 15 is inputted to the integer encoder 20. The integer encoder 20 encodes each integer value included in the transformed integer sequence $y\_1, y\_2, \ldots, y\_N$, obtains codes $C\_1, C\_2, \ldots, C\_N$ respectively and outputs a code group of the obtained codes as an integer code (step S20). The method for encoding each integer value may be any method if it is a method capable of obtaining codes for respective integer values included in the transformed integer sequence $y\_1, y\_2, \ldots, y\_N$.

For example, the integer encoder 20 determines the number of bits to be assigned to each integer value included in the transformed integer sequence $y\_1, y\_2, \ldots, y\_N$ and outputs a code group of codes $C\_1, C\_2, \ldots, C\_N$ obtained by encoding each integer value with the determined number of bits as an integer code. More specifically, the integer encoder 20 obtains a code representing each integer value included in the transformed integer sequence $y\_1, y\_2, \ldots, y\_N$ in binary numbers, stores each obtained code in the determined number of bits as code $C\_1, C\_2, \ldots, C\_N$, and outputs a code group of codes $C\_1, C\_2, \ldots, C\_N$ as an integer code.

<<Decoder>>

The decoder of the sixth embodiment corresponds to the decoder of the first embodiment or the third embodiment with the integer decoder 21 or 25 changed so as to decode integer codes under a decoding scheme corresponding to the encoding scheme carried out by the integer encoder 20 of the encoder of the sixth embodiment. As in the case of the decoder of the first embodiment or third embodiment, the decoder of the sixth embodiment is provided with, for example, the integer decoder 29 and the integer inverse transformer 22 or 26 as shown in FIG. 4, and the decoding method of the sixth embodiment is implemented by executing processes in respective steps shown in FIG. 5.

Since the integer decoder is the only part of the decoder of the sixth embodiment changed from the decoder of the first embodiment or third embodiment, only the integer decoder 29 will be described below.

[Integer Decoder 29]

N integer codes inputted to the decoder are inputted at a time to the integer decoder 29. The inputted integer codes here are assumed to be $C\_1, C\_2, \ldots, C\_N$. The integer decoder 29 decodes the inputted integer codes $C\_1, C\_2, \ldots, C\_N$, obtains integer values $y\_1, y\_2, \ldots, y\_N$ respectively, assumes the obtained sequence of integer values to be a transformed integer sequence $y\_1, y\_2, \ldots, y\_N$ and outputs the sequence to the integer inverse transformer 22 or 26 (step S29). The method for decoding each integer code is a decoding method corresponding to the encoding method performed by the integer encoder 20 of the corresponding encoder. That is, the method for decoding each integer code is a method for obtaining integer values for respective codes $C\_1, C\_2, \ldots, C\_N$ included in integer code and a method for obtaining one integer value for one code.

For example, the integer decoder 29 obtains binary numbers represented by the respective codes $C\_1, C\_2, \ldots, C\_N$ included in the integer codes as respective integer values $y\_1, y\_2, \ldots, y\_N$ and outputs the obtained sequence of integer values to the integer inverse transformer 22 or 26 as the transformed integer sequence $y\_1, y\_2, \ldots, y\_N$.

<<Operations and Effects>>

The encoder of the sixth embodiment obtains one code, which is the number of bits of integer values for the respective integer values included in the transformed integer sequence $y\_1, y\_2, \ldots, y\_N$ and the decoder of the sixth embodiment obtains the respective integer values included in the transformed integer sequence $y\_1, y\_2, \ldots, y\_N$ from one code, which is the number of bits of the integer values. That is, encoding is performed with the number of bits assigned in 1-bit units adjusted for the respective integer values included in the transformed integer sequence $y\_1, y\_2, \ldots, y\_N$. For the encoder of the sixth embodiment which is changed from the encoder of the first embodiment, this corresponds to integer values included in the integer sequence $x\_1, x\_2, \ldots, x\_{2N}$ inputted to the encoder being encoded with the number of bits assigned adjusted in ½-bit units, whereas for the encoder of the sixth embodiment which is changed from the encoder of the third embodiment, this corresponds to integer values included in the integer sequence $x\_1, x\_2, \ldots, x\_{MN}$ inputted to the encoder being encoded with the number of bits assigned adjusted in 1/M-bit units. Therefore, according to the sixth embodiment, it is possible to implement encoding and decoding that substantially assign the number of bits of a decimal value per sample.

The embodiments of the present invention have been described so far, but the specific configuration is not limited to these embodiments, and it goes without saying that even when any design change or the like is made without departing from the spirit and scope of the present invention, such a change is included in the invention. The various processes described in the embodiments may be executed not only time-sequentially in the described order but also in parallel or individually according to the processing capacity of the apparatus executing processing or as required.

<Program, Recording Medium>

When the various processing functions in each apparatus described in each of the above-described each apparatus are implemented using a computer, processing contents of a function to be possessed by each apparatus are written by a program. The various processing functions in each of the above-described embodiments are implemented on the computer by executing this program on the computer.

The program in which the processing contents are written can be recorded in a computer-readable recording medium. As the computer-readable recording medium, any medium can be used such as a magnetic recording device, an optical disk, a magneto-optical recording medium or a semiconductor memory.

Furthermore, this program is circulated, for example, by selling, transferring, or lending a portable recording medium such as DVD, CD-ROM that records the program. It may also be possible to adopt a configuration for circulating this program by storing this program in a storage device of a server computer and transferring the program from the server computer to other computers via a network.

The computer that executes such a program first stores, for example, a program recorded in a portable recording medium or a program transferred from the server computer in the own storage device. At the time of execution of a process, this computer reads the program stored in the own storage device and executes the process according to the read program. As another mode of execution of the program, the computer may read the program directly from a portable recording medium and execute a process according to the program. Furthermore, every time a program is transferred to the computer from the server computer, processes may be executed successively according to the received program. The above-described process may be executed by a so-called ASP (Application Service Provider) type service in which without the server computer transferring the program to the computer, the processing function is implemented only by instructing execution and acquiring results thereof. Note that the program includes a semi-program which is information used for processing by a computer (data which is not a direct instruction on the computer but has a characteristic of defining processing of the computer).

Although the present apparatus is configured by executing a predetermined program on the computer in the present embodiment, at least some of these processing contents may be implemented by hardware.

What is claimed is:

1. An encoder comprising:
an integer transformer that obtains one integer value (hereinafter referred to as a "transformed integer") through algebraically-representable bijective transformation for each of a plurality of sets of integer values included in an inputted sequence of integer values; and
an integer encoder that obtains a code by encoding the respective transformed integers, wherein
assuming that MA is the number of integer values included in the set of integer values, $x_1, x_2, \ldots, x_{MA}$ are integer values included in the set of integer values, the integer transformer obtains the transformed integer y which is the one integer value by calculating the following formula:

$$y = f_M(x_1, x_2, \ldots, x_{MA})$$

where assuming that $x_{max}$ is a maximum value of $x_1, x_2, \ldots, x_{M'}$, K is the number of integer values of $x_1, x_2, \ldots, x_{M'}$ that take maximum values, $m_1, m_2, \ldots, mx$ are numbers of integer values of $x_1, x_2, \ldots, x_{M'}$ that take maximum values, $\tilde{x}_1, \tilde{x}_2, \ldots, \tilde{x}_{M'-K}$ are integer values of $x_1, x_2, \ldots, x_{M'}$ except K integer values that take maximum values, $_M C_m$ is the number of combinations for selecting "m" integer values from "M'" integer values, $_{M'}C_K$ is the number of combinations for selecting "K" integer values from "M'" integer values, $_{M'-m_{i+1}}C_{K-i}$ is the number of combinations for selecting "K-i" integer values from "M'-$m_{i+1}$" integer values, the function $f_{M'}$ used in the above formula is a recursive function that calculates the following formula:

$$f_{M'}(x_1, x_2, \ldots, x_{M'}) =$$
$$\sum_{m=0}^{K-1} {}_{M'}C_m x_{max}^{M'-m} + {}_{M'}C_K f_{M'-K}(\tilde{x}_1, \tilde{x}_2, \ldots, \tilde{x}_{M'-K}) + \sum_{i=0}^{K-1} {}_{M'-m_{i+1}}C_{K-i}$$

provided $f_{M'-k}(\tilde{x}_1, \tilde{x}_2, \ldots, \tilde{x}_{M'-K}) = 0$ if $M' - K = 0$.

2. An encoder comprising:
an integer transformer that obtains one integer value (hereinafter referred to as a "transformed integer") through algebraically-representable bijective transformation for each of a plurality of sets of integer values included in an inputted sequence of integer values; and
an integer encoder that obtains a code by encoding the respective transformed integers, wherein
assuming that
MA is the number of integer values included in the set of integer values,
$x_1, x_2, \ldots, x_{MA}$ are integer values included in the set of integer values,
K is the maximum number of bits of $x_1, x_2, \ldots, x_{MA}$ in binary notation,
i is each integer equal to or greater than 1 and equal to or less than MA, and
a_(K, i), a_(K−1, i), . . . a_(1, i) are values of the respective digits of $x_i$ in binary notation where a_(K, i) is the most significant bit of $x_i$ and a_(1, i) is the least significant bit of $x_i$,
the integer transformer obtains, as binary notation of the transformed integer which is said one integer value, a_(K, MA), a_(K, MA−1), . . . , a_(K, 1), a_(K−1, MA), . . . , a_(K−1, 1), . . . , a_(1, 1) where a_(K, MA) is the most significant bit and a_(1, 1) is the least significant bit.

3. An encoder comprising:
an integer transformer that obtains a plurality of integer values (hereinafter referred to as "transformed integers") through bijective transformation for each of integer values included in an inputted sequence of integer values; and an integer encoder that obtains a code by encoding the transformed integers, wherein assuming that MB is the number of the transformed integers obtained through the transformation from one inputted integer value and x is an integer value included in the sequence of integer values, the integer transformer obtains the transformed integers $y_1, y_2, \ldots, y_{MB}$ by calculating the following formula:

$$(y_1, y_2, \ldots, y_{MB}) = g_{MB}(x)$$

where assuming that $$\lfloor \sqrt[M']{x} \rfloor$$

is a maximum M'-th order square root that does not exceed x, $_{M'}C_m$ is the number of combinations for selecting "m" integer values from "M'" integer values, $_{M'}C_K$ is the number of combinations for selecting "K" integer values from "M'" integer values, $_{M'-m-1}C_{K-i_1}$ is the number of combinations for selecting "K-$i_1$" integer values from "M'-m-1" integer values, and K is a maximum value when $$x - \sum_{m=0}^{K-1} {}_{M'}C_m \lfloor \sqrt[M']{x} \rfloor^{M'-m}$$

is not less than 0, $\tilde{y}_1, \tilde{y}_2, \ldots, \tilde{y}_{M'-K}$ is an integer sequence of (M'-K) variables obtained from:

$$g_{M'-K}\left(\left[x - \sum_{m=0}^{K-1} {}_{M'}C_m \lfloor \sqrt[M']{x} \rfloor^{M'-m}\right] / {}_{M'}C_m\right) \text{ provided}$$

$$g_{M'-K}\left(\left[\left(x - \sum_{m=0}^{K-1} {}_{M'}C_m \lfloor \sqrt[M']{x} \rfloor^{M'-m}\right) / {}_{M'}C_K\right]\right) \text{ outputs nothing if}$$

$$M' - K = 0,$$

$\lambda_{M'}$ is a remainder of dividing:

$$x - \sum_{m=0}^{K-1} {}_{M'}C_m \lfloor \sqrt[M']{x} \rfloor^{M'-m}$$

by $_{M'}C_K$, and $i_1=0$ and $i_2=0$ are initial values with respect to m=0, 1, . . . , M'-1, the function $g_{M'}$ used in the above formula is a recursive function to calculate the following formula:

if $\lambda_{M'} \geq {}_{M'-m-1}C_{K-i_1}$ $y_{m+1} = \lfloor \sqrt[M']{x} \rfloor$ $\lambda_{M'} = \lambda_M - {}_{M'-m-1}C_{K-i_1}$ $i_1 = i_1 + 1$ otherwise $y_{m+1} = \tilde{y}_{i_2+1}$ $i_2 = i_2 + 1$.

4. An encoder comprising:

an integer transformer that obtains a plurality of integer values (hereinafter referred to as "transformed integers") through bijective transformation for each of integer values included in an inputted sequence of integer values; and an integer encoder that obtains a code by encoding the transformed integers, wherein assuming that:

MB is the number of the transformed integers obtained through the transformation from one inputted integer value, x is an integer value included in the sequence of integer values, K is a number obtained by dividing the number of bits of x in binary notation by MB, and a_(MB×K), a_(MB×K–1), . . . , a_(1) are values of the respective digits of x in binary notation, the integer transformer obtains, as binary notation of integer values included in the transformed integers, MB K-bit integer values as follows:

a_(MB×K),a_(MB×(K–1)), . . . ,a_(MB)

a_(MB×K–1),a_(MB×(K–1)–1), . . . ,a_(MB–1)

a_(MB×(K–1)+2),a_(MB×(K–2)+2), . . . ,a_(2)

a_(MB×(K–1)+1),a_(MB×(K–2)+1), . . . ,a_(1).

5. An encoder comprising:

assuming that an integer sequence is a partial sequence consisting of predetermined number of integers in an inputted sequence of integer values, a parameter determiner that obtains an index value corresponding to a property of distribution of integer values in each of the integer sequence;

an integer transformer that selects a transformation process based on the index value from a plurality of alternatives including at least transformation process A and B, and obtains a sequence of transformed integers by performing the selected transformation process on the integer sequence, wherein the transformation process A obtains one integer value as a transformed integer through bijective transformation for each set of a plurality of integer values (MA integer values; MA is an integer equal to or greater than 2) included in the integer sequence; and the transformation process B obtains a plurality of integer values (MB integer values; MB is an integer equal to or greater than 2) as transformed integers, through bijective transformation for each integer value included in the integer sequence, and an integer encoder that obtains a code by encoding each integer value included in the sequence of transformed integers.

6. The encoder according to claim 5, wherein the plurality of alternatives comprise at least one of:

a transformation process A corresponding to each of at least two different MA values; and a transformation process B corresponding to each of at least two different MB values.

7. The encoder according to claim 5 or 6, wherein the parameter determiner estimates an envelope by regarding an $\eta_0$-th power of absolute values of respective integer values included in the integer sequence or the $\eta_0$-th power of absolute values of respective sample values included in a sample sequence corresponding to the integer sequence using a positive parameter no determined by a predetermined method as each value of the power sequence, obtains a whitened spectral sequence which is a sequence obtained by dividing each integer value included in the integer sequence or each sample value included in the sample sequence by each value of the envelope, obtains a positive parameter n with which a generalized Gaussian distribution using the parameter η as a shape parameter approximates a histogram of the whitened spectral sequence as the index value, the plurality of alternatives include a transformation process A corresponding to at least two different MAs, and in the selection of a transformation process based on the index value, a transformation process having a greater MA value is selected as the value of η increases.

8. The encoder according to claim 5 or 6, wherein the parameter determiner estimates an envelope by regarding an $\eta_0$-th power of absolute values of respective integer values included in the integer sequence or the $\eta_0$-th power of absolute values of respective sample values included in a sample sequence corresponding to the integer sequence using a positive parameter to determined by a predetermined method as each value of the power sequence, obtains a whitened spectral sequence which is a sequence obtained by dividing each integer value included in the integer sequence or each sample value included in the sample sequence by each value of the envelope, obtains a positive parameter η with which a generalized Gaussian distribution using the parameter η as a shape parameter approximates a histogram of the whitened spectral sequence as the index value, the plurality of alternatives include a transformation process B corresponding to at least two different MBs, and in the selection of a transformation process based on the index value, a transformation process having a greater MB value is selected as the value of η decreases.

9. The encoder according to claim 5 or 6, wherein the parameter determiner estimates an envelope by regarding an $\eta_0$-th power of absolute values of respective integer values included in the integer sequence or the $\eta_0$-th power of absolute values of respective sample values included in a sample sequence corresponding to the integer sequence using a positive parameter $\eta_0$ determined by a predetermined method as each value of the power sequence, obtains a whitened spectral sequence which is a sequence obtained by dividing each integer value included in the integer sequence or each sample value included in the sample sequence by each value of the envelope, obtains a positive parameter η with which a generalized Gaussian distribution using the parameter η as a shape parameter approximates a histogram of the whitened spectral sequence as the index value, the plurality of alternatives include at least one transformation process A and at least one transformation process B, and the value of η when the transformation process A is selected is greater than the value of η when the transformation process B is selected in the selection of a transformation process based on the index value.

10. The encoder according to any one of claims 1 to 6, wherein the integer encoder obtains a code by Golomb-Rice encoding the transformed integer.

11. A decoder comprising:

an integer decoder that obtains one integer value (hereinafter referred to as a "transformed integer") by decoding an inputted code; and an integer inverse transformer that obtains a plurality of integer values from the transformed integer through algebraically-representable bijective transformation, wherein assuming that MA is the number of integer values obtained through the transformation from the transformed integer and y is the transformed integer, the integer inverse transformer obtains the plurality of integer values $x_1, x_2, \ldots, x_{MA}$ by calculating the following formula:

$$(x_1, x_2, \ldots, x_{MA}) = f_{MA}^{-1}(y)$$

where assuming that $$\lfloor \sqrt[M']{x} \rfloor$$

is a maximum M'-th order square root that does not exceed y, $_{M'}C_m$ is the number of combinations for selecting "m" integer values from "M'" integer values, $_{M'}C_K$ is the number of combinations for selecting "K" integer values from "M'" integer values, $_{M'-m-1}C_{K-i_1}$ is the number of combinations for selecting "K–$i_1$" integer values from "M'–m–1" integer values, K is a maximum value when $$y - \sum_{m=0}^{K-1} {}_{M'}C_m \lfloor \sqrt[M']{x} \rfloor^{M'-m}$$

is not less than 0, $\tilde{x}_1, \tilde{x}_2, \ldots, \tilde{x}_{M'-K}$ is an integer sequence of (M'–K) variables obtained from $$f_{M'-K}^{-1}\left(\left\lfloor y - \sum_{m=0}^{K-1} {}_{M'}C_m \lfloor \sqrt[M']{y} \rfloor^{M'-m}\right) / {}_{M'}C_m \rfloor\right) \text{ provided}$$

$$f_{M'-K}^{-1}\left(\left\lfloor y - \sum_{m=0}^{K-1} {}_{M'}C_m \lfloor \sqrt[M']{y} \rfloor^{M'-m}\right) / {}_{M'}C_m \rfloor\right) \text{ outputs nothing if}$$

$$M' - K = 0,$$

$\lambda_{M'}$ is a remainder of dividing:

$$y - \sum_{m=0}^{K-1} {}_{M'}C_m \lfloor \sqrt[M']{y} \rfloor^{M'-m}$$

by $_{M'}C_K$, and $i_1=0$ and $i_2=0$ are initial values with respect to m=0, 1, . . . , M'–1, the function $f_{M'}^{-1}$ used for the above formula is a recursive function to calculate the following formula:

if $\lambda_{M'} \geq {}_{M'-m-1}C_{K-i_1}$ $$x_{m+1} = \lfloor \sqrt[M']{y} \rfloor$$

$$\lambda_{M'} = \lambda_{M'} - {}_{M'-m-1}C_{K-i_1}$$

$$i_1 = i_1 + 1$$

-continued otherwise $x_{m+1} = \tilde{x}_{i_2+1}$ $i_2 = i_2 + 1.$

12. A decoder comprising:
an integer decoder that obtains one integer value (hereinafter referred to as a "transformed integer") by decoding an inputted code; and
an integer inverse transformer that obtains a plurality of integer values from the transformed integer through algebraically-representable bijective transformation, wherein assuming that
MA is the number of integer values obtained through the transformation from the transformed integer,
y is the transformed integer,
K is a number obtained by dividing the number of bits of y in binary notation by MA, and
a_(MA×K), a_(MA×K–1), . . . , a_(1) are values of the respective digits of y in binary notation
the integer inverse transformer obtains, as binary notation of each of the plurality of integer values, MA K-bit integer values as follows;

$a\_(MA{\times}K), a\_(MA{\times}(K-1)), \ldots, a\_(MA)$ $a\_(MA{\times}K-1), a\_(MA{\times}(K-1)-1), \ldots, a\_(MA-1)$ $a\_(MA{\times}(K-1)+2), a\_(MA{\times}(K-2)+2), \ldots, a\_(2)$ $a\_(MA{\times}(K-1)+1), a\_(MA{\times}(K-2)+1), \ldots, a\_(1).$ 13. A decoder comprising:
an integer decoder that obtains a plurality of integer values (hereinafter referred to as "transformed integers") by decoding an inputted code; and
an integer inverse transformer that obtains one integer value from the transformed integers through bijective transformation, wherein
assuming that MB is the number of transformed integers to be transformed to obtain one integer value, $y_1$, $y_2 \ldots, y_{MB}$ are integer values included in the transformed integers, the integer inverse transformer obtains the one integer value x by calculating the following formula:

$x = g_{MB}^{-1}(y_1, y_2, \ldots, y_{MB})$ where assuming that $y_{max}$ is a maximum value of $y_1, y_2, \ldots, y_{M'}$, K is the number of integer values of $y_1, y_2, \ldots, y_{M'}$ that take maximum values, $m_1$, $m_2, \ldots, m_K$ are numbers of the integer values of $y_1$, $y_2, \ldots, y_{M'}$ that take maximum values, $\tilde{y}_1, \tilde{y}_2, \ldots, \tilde{y}_{M'-K}$ are integer values of $y_1$, $y_2, \ldots, y_{M'}$ except K integer values that take maximum values, ${}_{M'}C_m$ is the number of combinations for selecting "m" integer values from "M'" integer values, ${}_{M'}C_K$ is the number of combinations for selecting "K" integer values from "M'" integer values, ${}_{M'-m_{i+1}}C_{K-i}$ is the number of combinations for selecting "K–i" integer values from "M'–$m_{i+1}$" integer values, the function $g_{M'}$ used in the above formula is a recursive function that calculates the following formula:

$g_{M'}^{-1}(y_1, y_2, \ldots, y_{M'}) =$ $\sum_{m=0}^{K-1} {}_{M'}C_m y_{max}^{M'-m} + {}_{M'}C_K g_{M'-K}^{-1}(\tilde{y}_1, \tilde{y}_2, \ldots, \tilde{y}_{M'-K}) + \sum_{i=0}^{K-1} {}_{M'-m_{i+1}}C_{K-i}$ provided $g_{M'-K}^{-1}(\tilde{y}_1, \tilde{y}_2, \ldots, \tilde{y}_{M'-K}) = 0$ if $M' - K = 0$.

14. A decoder comprising:
an integer decoder that obtains a plurality of integer values (hereinafter referred to as "transformed integers") by decoding an inputted code; and
an integer inverse transformer that obtains one integer value from the transformed integers through bijective transformation, wherein
assuming that
MB is the number of transformed integers to be transformed to obtain one integer value,
$y_1, y_2, \ldots, y_{MB}$ are integer values included in the transformed integers,
K is a maximum number of bits of $y_1, y_2, \ldots, y_{MB}$ in binary notation,
i is each integer equal to or greater than 1 and equal to or less than MB, and
a_(K, i), a_(K–1, i), . . . , a_(1, i) are values of each digit of $y_i$ in binary notation where a_(K, i) is the most significant bit of $y_1$ and a_(1, i) is the least significant bit of $y_i$,
the integer inverse transformer obtains, as binary notation of the one integer value, a_(K, MB), a_(K, MB–1), . . . , a_(K, 1), a_(K–1, MB), . . . , a_(K–1, 1), . . . , a_(1, 1) where a_(K, MB) is the most significant bit and a_(1, 1) is the least significant bit.

15. A decoder that obtains a decoded integer sequence by decoding an inputted parameter code and integer codes for each predetermined section, the decoder comprising:
a parameter decoder that obtains an index value by decoding the inputted parameter code for each predetermined section;
an integer decoder that obtains a sequence (hereinafter referred to as a "transformed integer sequence") of integer values (hereinafter referred to as "transformed integers") by decoding the inputted integer codes for each predetermined section; and
an integer inverse transformer that selects a transformation process for each predetermined section based on the index value for each predetermined section from among a plurality of alternatives including at least an inverse transformation process A and B, and obtains a sequence of integer values as the decoded integer sequence by performing the selected transformation process on the transformed integer sequence for every predetermined section, wherein
the inverse transformation process A obtains a plurality of integer values (MA integers; MA is an integer equal to or greater than 2) through bijective transformation for each transformed integer included in the transformed integer sequence; and
the inverse transformation process B obtains one integer value through bijective transformation for a plurality of transformed integers (MB integer values; MB is an integer equal to or greater than 2) included in the transformed integer sequence.

16. The decoder according to any one of claims 11 to 15, wherein the integer decoder obtains a transformed integer by Golomb-Rice decoding the code.

17. An encoding method comprising:
an integer transforming step in which an integer transformer obtains one integer value (hereinafter referred to as a "transformed integer") through algebraically-representable bijective transformation for each of a plurality of sets of integer values included in an inputted sequence of integer values; and
an integer encoding step in which an integer encoder obtains a code by encoding the respective transformed integers, wherein
assuming that MA is the number of integer values included in the set of integer values and $x_1, x_2, \ldots x_{MA}$ are integer values included in the set of integer values, the integer transforming step obtains a transformed integer y which is the one integer value by calculating the following formula:

$$y = f_{MA}(x_1, x_2, \ldots, x_{MA})$$

where assuming that $x_{max}$ is a maximum value of $x_1, x_2, \ldots, x_{M'}$, K is the number of integer values of $x_1, x_2, \ldots, x_{M'}$ that take maximum values, $m_1, m_2, \ldots, m_K$ are numbers of integer values of $x_1, x_2, \ldots, x_{M'}$ that take maximum values, $\tilde{x}_1, \tilde{x}_2, \ldots, \tilde{x}_{M'-K}$ are integer values of $x_1, x_2, \ldots, x_{M'}$ except K integer values that take maximum values, $_M C_m$ is the number of combinations for selecting "m" integer values from "M'" integer values, $_M C_K$ is the number of combinations for selecting "K" integer values from "M'" integer values, $_{M'-m_{i+1}} C_{K-i}$ is the number of combinations for selecting "K−i" integer values from "M'−$m_{i+1}$" integer values, the function $f_{M'}$ used in the above formula is a recursive function that calculates the following formula:

$$f_{M'}(x_1, x_2, \ldots, x_{M'}) = $$

$$\sum_{m=0}^{K-1} {}_{M'}C_m x_{max}^{M'-m} + {}_{M'}C_K f_{M'-K}(\tilde{x}_1, \tilde{x}_2, \ldots, \tilde{x}_{M'-K}) + \sum_{i=0}^{K-1} {}_{M'-m_{i+1}}C_{K-i}$$

provided $f_{M'-K}(\tilde{x}_1, \tilde{x}_2, \ldots, \tilde{x}_{M'-K}) = 0$ if $M' - K = 0$.

18. An encoding method comprising:
an integer transforming step in which an integer transformer obtains one integer value (hereinafter referred to as a "transformed integer") through algebraically-representable bijective transformation for each of a plurality of sets of integer values included in an inputted sequence of integer values; and
an integer encoding step in which an integer encoder obtains a code by encoding the respective transformed integers, wherein
assuming that
MA is the number of integer values included in the set of integer values,
$x_1, x_2, \ldots, x_{MA}$ are integer values included in the set of integer values,
K is the maximum number of bits of $x_1, x_2, \ldots, x_{MA}$ in binary notation,
i is each integer equal to or greater than 1 and equal to or less than MA, and
a_(K, i), a_(K−1, i), . . . , a_(1, i) are values of the respective digits of $x_1$ in binary notation where a(K, i) is the most significant bit of $x_i$ and a_(1, i) is the least significant bit of $x_i$,
the integer transforming step obtains, as binary notation of the transformed integer which is said one integer value, a_(K, MA), a_(K, MA−1), . . . a_(K, 1), a_(K−1, MA), . . . , a_(K−1, 1), . . . , a_(1, 1) where a_(K, MA) is the most significant bit and a_(1, 1) is the least significant bit.

19. An encoding method comprising:
n integer transforming step in which an integer transformer obtains a plurality of integer values (hereinafter referred to as "transformed integers") through bijective transformation for each of integer values included in an inputted sequence of integer values; and
an integer encoding step in which an integer encoder obtains a code by encoding the transformed integers, wherein
assuming that MB is the number of the transformed integers obtained through the transformation from one inputted integer value and x is an integer value included in the sequence of integer values, the integer transformer obtains the transformed integers $y_1, y_2, \ldots y_{MB}$ by calculating the following formula:

$$(y_1, y_2, \ldots, y_{MB}) = g_{MB}(x)$$

where assuming that $$\lfloor \sqrt[M']{x} \rfloor$$

is a maximum M'-th order square root that does not exceed x, $_{M'}C_m$ is the number of combinations for selecting "m" integer values from "M'" integer values, $_{M'}C_K$ is the number of combinations for selecting "K" integer values from "M'" integer values, $_{M'-m-1}C_{K-i_1}$ is the number of combinations for selecting "K−$i_1$" integer values from "M'−m−1" integer values, and K is a maximum value when $$x - \sum_{m=0}^{K-1} {}_{M'}C_m \lfloor \sqrt[M']{x} \rfloor^{M'-m}$$

is not less than 0, $\tilde{y}_1, \tilde{y}_2, \ldots, \tilde{y}_{M'-K}$ is an integer sequence of (M'−K) variables obtained from:

$$g_{M'-K}\left(\left(\left(x - \sum_{m=0}^{K-1} {}_{M'}C_m \lfloor \sqrt[M']{x} \rfloor^{M'-m}\right) / {}_{M'}C_K\right)\right) \text{ provided}$$

$$g_{M'-K}\left(\left(\left(x - \sum_{m=0}^{K-1} {}_{M'}C_m \lfloor \sqrt[M']{x} \rfloor^{M'-m}\right) / {}_{M'}C_K\right)\right) \text{ outputs nothing if}$$

$$M' - K = 0,$$

$\lambda_{M'}$ is a remainder of dividing:

$$x - \sum_{m=0}^{K-1} {}_{M'}C_m \lfloor \sqrt[M']{x} \rfloor^{M'-m}$$

by $_{M'}C_K$, and $i_1=0$ and $i_2=0$ are initial values with respect to m=0, 1, . . . , M'−1, the function $g_{M'}$ used in the above formula is a recursive function to calculate the following formula:

if $\lambda_{M'} \geq {}_{M'-m-1}C_{K-i_1}$ $$y_{m+1} = \lfloor \sqrt[M']{x} \rfloor$$

-continued $$\lambda_{M'} = \lambda_{M'} -_{M'-m-1} C_{K-i_1}$$

$$i_1 = i_1 + 1$$

otherwise $$y_{m+1} = \tilde{y}_{i_2+1}$$

$$i_2 = i_2 + 1.$$

20. An encoding method comprising:
an integer transforming step in which an integer transformer obtains a plurality of integer values (hereinafter referred to as "transformed integers") through bijective transformation for each of integer values included in an inputted sequence of integer values; and
an integer encoding step in which an integer encoder obtains a code by encoding the transformed integers, wherein
assuming that:
MB is the number of the transformed integers obtained through the transformation from one inputted integer value,
x is an integer value included in the sequence of integer values,
K is a number obtained by dividing the number of bits of x in binary notation by MB, and
a_(MB×K), a_(MB×K−1), . . . , a_(1) are values of the respective digits of x in binary notation
the integer transforming step obtains, as binary notation of integer values included in the transformed integers, MB K-bit integer values as follows:

$$a\_(MB{\times}K), a\_(MB{\times}(K-1)), \ldots, a\_(MB)$$

$$a\_(MB{\times}K-1), a\_(MB{\times}(K-1)-1), \ldots, a\_(MB{-}1)$$

$$a\_(MB{\times}(K-1)+2), a\_(MB{\times}(K-2)+2), \ldots, a\_(2)$$

$$a\_(MB{\times}(K-1)+1), a\_(MB{\times}(K-2)+1), \ldots, a\_(1).$$

21. An encoding method comprising:
assuming that an integer sequence is a partial sequence consisting of predetermined number of integers in an inputted sequence of integer values,
a parameter determining step in which a parameter determiner obtains an index value corresponding to a property of distribution of integer values in each of the integer sequence; an integer transforming step in which an integer transformer selects a transformation process based on the index value from a plurality of alternatives including at least transformation process A and B, and obtains a sequence of transformed integers by performing the selected transformation process on the integer sequence, wherein
the transformation process A obtains one integer value as a transformed integer through bijective transformation for each set of a plurality of integer values (MA integer values; MA is an integer equal to or greater than 2) included in the integer sequence; and
the transformation process B obtains a plurality of integer values (MB integer values; MB is an integer equal to or greater than 2) as transformed integers, through bijective transformation for each integer value included in the integer sequence, and
an integer encoding step in which an integer encoder obtains a code by encoding each integer value included in the sequence of transformed integers.

22. A decoding method comprising:
an integer decoding step in which an integer decoder obtains one integer value (hereinafter referred to as a "transformed integer") by decoding an inputted code; and
an integer inverse transforming step in which an integer inverse transformer obtains a plurality of integer values from the transformed integer through algebraically-representable bijective transformation, wherein
assuming that MA is the number of integer values obtained through the transformation from the transformed integer and y is the transformed integer, the integer inverse transforming step obtains the plurality of integer values $x_1, x_2, \ldots, x_{MA}$ by calculating the following formula:

$$(x_1, x_2, \ldots, x_{MA}) = f_{MA}^{-1}(y)$$

where assuming that $$\lfloor \sqrt[M']{y} \rfloor$$

is a maximum M'-th order square root that does not exceed y, $_{M'}C_m$ is the number of combinations for selecting "m" integer values from "M'" integer values, $_{M'}C_K$ is the number of combinations for selecting "K" integer values from "M'" integer values, $_{M'-m-1}C_{K-i_1}$ is the number of combinations for selecting "K−i$_1$" integer values from "M'-m−1" integer values, K is a maximum value when $$y - \sum_{m=0}^{K-1} {}_{M'}C_m \lfloor \sqrt[M']{y} \rfloor^{M'-m}$$

is not less than 0, $\bar{x}_1, \bar{x}_2, \ldots, \bar{x}_{M'-K}$ is an integer sequence of (M'−K) variables obtained from $$f_{M'-K}^{-1}\left(\left[\left(y - \sum_{m=0}^{K-1} {}_{M'}C_m \lfloor \sqrt[M']{y} \rfloor^{M'-m}\right)/{}_{M'}C_K\right]\right) \text{ provided}$$

$$f_{M'-K}^{-1}\left(\left[\left(y - \sum_{m=0}^{K-1} {}_{M'}C_m \lfloor \sqrt[M']{y} \rfloor^{M'-m}\right)/{}_{M'}C_K\right]\right) \text{ outputs nothing if}$$

$$M' - K = 0,$$

$\lambda_{M'}$ is a remainder of dividing $$y - \sum_{m=0}^{K-1} {}_{M'}C_m \lfloor \sqrt[M']{y} \rfloor^{M'-m}$$

by $_{M'}C_K$, and i$_1$=0 and i$_2$=0 as initial values with respect to m=0, 1, . . . , M'−1, the function $f_{M'}^{-1}$ used for the above formula is a recursive function to calculate the following formula:

if $\lambda_{M'} \geq {}_{M'-m-1}C_{K-i_1}$ $$x_{m+1} = \lfloor \sqrt[M']{y} \rfloor$$

$$\lambda_{M'} = \lambda_{M'} - {}_{M'-m-1}C_{K-i_1}$$

$$i_1 = i_1 + 1$$

-continued otherwise $$x_{m+1} = \tilde{x}_{i_2+1}$$
$$i_2 = i_2 + 1.$$

23. A decoding method comprising:
an integer decoding step in which an integer decoder obtains one integer value (hereinafter referred to as a "transformed integer") by decoding an inputted code; and
an integer inverse transforming step in which an integer inverse transformer obtains a plurality of integer values from the transformed integer through algebraically-representable bijective transformation, wherein
assuming that
MA is the number of integer values obtained through the transformation from the transformed integer,
y is the transformed integer,
K is a number obtained by dividing the number of bits of y in binary notation by MA, and
a_(MA×K), a_(MA×K−1), . . . , a_(1) are values of the respective digits of y in binary notation,
the integer inverse transforming step obtains, as binary notation of each of the plurality of integer values, MA K-bit integer values as follows;

$$a\_(MA \times K), a\_(MA \times (K-1)), \ldots, a\_(MA)$$

$$a\_(MA \times K-1), a\_(MA \times (K-1)-1), \ldots, a\_(MA-1)$$

$$a\_(MA \times (K-1)+2), a\_(MA \times (K-2)+2), \ldots, a\_(2)$$

$$a\_(MA \times (K-1)+1), a\_(MA \times (K-2)+1), \ldots, a\_(1).$$

24. A decoding method comprising:
an integer decoding step in which an integer decoder obtains a plurality of integer values (hereinafter referred to as "transformed integers") by decoding an inputted code; and
an integer inverse transforming step in which an integer inverse transformer obtains one integer value from the transformed integers through bijective transformation, wherein
assuming that MB is the number of transformed integers to be transformed to obtain one integer value, $y_1$, $y_2$, . . . , $y_{MB}$ are integer values included in the transformed integers, the integer inverse transforming step obtains the one integer value x by calculating the following formula:

$$x = g_{MB}^{-1}(y_1, y_2, \ldots, y_{MB})$$

where assuming that $y_{max}$ is a maximum value of $y_1$, $y_2$, . . . , $y_{M'}$, K is the number of integer values of $y_1$, $y_2$, . . . , $y_{M'}$ that take maximum values, $m_1$, $m_2$, . . . , $m_K$ are numbers of the integer values of $y_1$, $y_2$, . . . , $y_{M'}$ that take maximum values, $\tilde{y}_1$, $\tilde{y}_2$, . . . , $\tilde{y}_{M'-K}$ are integer values of $y_1$, $y_2$, . . . , $y_{M'}$ except K integer values that take maximum values, ${}_M C_m$ is the number of combinations for selecting "m" integer values from "M'" integer values, ${}_{M'} C_K$ is the number of combinations for selecting "K" integer values from "M'" integer values, ${}_{M'-m_{i+1}} C_{K-i}$ is the number of combinations for selecting "K−i" integer values from "M'−$m_{i+1}$" integer values, the function $g_{M'}$ used in the above formula is a recursive function that calculates the following formula:

$$g_{M'}^{-1}(y_1, y_2, \ldots, y_{M'}) =$$

$$\sum_{m=0}^{K-1} {}_{M'} C_m y_{max}^{M'-m} + {}_{M'} C_K g_{M'-K}^{-1}(\tilde{y}_1, \tilde{y}_2, \ldots, \tilde{y}_{M'-K}) + \sum_{i=0}^{K-1} {}_{M'-m_{i+1}} C_{K-i}$$

provided $g_{M'-K}^{-1}(\tilde{y}_1, \tilde{y}_2, \ldots, \tilde{y}_{M'-K}) = 0$ if $M' - K = 0$.

25. A decoding method comprising:
an integer decoding step in which an integer decoder obtains a plurality of integer values (hereinafter referred to as "transformed integers") by decoding an inputted code; and
an integer inverse transforming step in which an integer inverse transformer obtains one integer value from the transformed integers through bijective transformation, wherein
assuming that
MB is the number of transformed integers to be transformed to obtain one integer value,
$y_1$, $y_2$, . . . , $y_{MB}$ are integer values included in the transformed integers,
K is a maximum number of bits of $y_1$, $y_2$, . . . , $y_{MB}$ in binary notation,
i is each integer equal to or greater than 1 and equal to or less than MB, and
a_(K, i), a_(K−1, i), . . . , a_(1, i) are values of each digit of $y_i$ in binary notation where a_(K, i) is the most significant bit of $y_i$ and a_(1, i) is the least significant bit of $y_i$,
the integer inverse transforming step obtains, as binary notation of the one integer value, a_(K, MB), a_(K, MB−1), . . . a_(K, 1), a_(K−1, MB), . . . , a_(K−1, 1), . . . , a_(1, 1) where a_(K, MB) is the most significant bit and a_(1, 1) is the least significant bit.

26. A decoding method that obtains a decoded integer sequence by decoding an inputted parameter code and an integer code for each predetermined section, the decoding method comprising:
a parameter decoding step in which a parameter decoder obtains an index value by decoding the inputted parameter code for each predetermined section;
an integer decoding step in which an integer decoder obtains a sequence of integer values (hereinafter referred to as a "transformed integer sequence") by decoding the inputted integer code for each predetermined section; and
an integer inverse transforming step in which an integer inverse transformer selects a transformation process for each predetermined section based on the index value for each predetermined section from among a plurality of alternatives including at least an inverse transformation process A and B, and obtains a sequence of integer values as the decoded integer sequence by performing the selected transformation process on the transformed integer sequence for every predetermined section, wherein
the inverse transformation process A obtains a plurality of integer values (MA integers; MA is an integer equal to or greater than 2) through bijective transformation for each transformed integer included in the transformed integer sequence; and
the inverse transformation process B obtains one integer value through bijective transformation for a plurality of transformed integers (MB integer values; MB is an integer equal to or greater than 2) included in the transformed integer sequence.

27. A non-transitory computer-readable recording medium having a program recorded thereon for causing a computer to function as the encoder according to any one of claims 1 to 6.

28. A non-transitory computer-readable recording medium having a program recorded thereon for causing a computer to function as the decoder according to any one of claims 11 to 15.

* * * * *